United States Patent
Watanabe

[19]

[11] Patent Number: 6,133,601
[45] Date of Patent: Oct. 17, 2000

[54] NON-VOLATILE SEMICONDUCTOR MEMORY DEVICE WITH INTER-LAYER INSULATION FILM

[75] Inventor: Toshiharu Watanabe, Yokohama, Japan

[73] Assignee: Kabushiki Kaisha Toshiba, Kawasaki, Japan

[21] Appl. No.: 08/988,712

[22] Filed: Dec. 10, 1997

[30] Foreign Application Priority Data

Dec. 11, 1996 [JP] Japan .................................. 8-330786

[51] Int. Cl.[7] ..................... H01L 29/788; H01L 29/792
[52] U.S. Cl. ..................... 257/314; 257/315; 257/316; 257/324; 257/325; 438/257; 438/261; 365/182
[58] Field of Search ................................ 257/324, 325, 257/316, 315, 314; 438/257, 261; 365/182

[56] References Cited

U.S. PATENT DOCUMENTS

| | | | |
|---|---|---|---|
| 5,138,573 | 8/1992 | Jeuch | 365/182 |
| 5,793,078 | 8/1998 | Takeuchi | 257/315 |
| 5,841,162 | 11/1998 | Enomoto | 257/315 |

*Primary Examiner*—William Mintel
*Attorney, Agent, or Firm*—Foley & Lardner

[57] ABSTRACT

In the semiconductor substrate, an insulation film designed for the element separation is formed. A gate insulation film and a floating gate electrode are formed in the element region surrounded by the insulation film for the element separation. The lower portions of the four lateral surfaces of the floating gate electrode are covered by the interlayer insulation film. The interlayer insulation film is made thicker than the gate insulation film. The upper surface of the floating gate electrode and the upper portions of the four lateral surfaces are covered by the control gate electrode. The upper surface of the control gate electrode is made flat. With this structure, the electrostatic capacitance between the floating gate electrode and the control gate electrode can be increased and stabilized.

9 Claims, 17 Drawing Sheets

NON-VOLATILE SEMICONDUCTOR MEMORY DEVICE WITH INTER-LAYER INSULATION FILM

BACKGROUND OF THE INVENTION

The present invention relates to a non-volatile semiconductor memory device such as a flash memory, and a method of manufacturing such a device.

FIG. 1 is a plan view of a memory cell of a conventional non-volatile semiconductor memory device. FIG. 2 is a cross sectional view taken along the line II—II in FIG. 1. FIG. 3 is a cross sectional view taken along the line III—III.

A p-type semiconductor substrate 1.1 has a narrow groove for element separation, formed in the substrate, and the groove is filled with an insulation film 1.2 (that is, STI (shallow trench isolation) structure).

In an element region surrounded by the insulation film 1.2, an n-type source-drain diffusion layer 1.7 is formed. On a channel region between the source-drain diffusion layer 1.7, a floating gate electrode 1.3 is formed via a gate insulation film 1.4. The gate insulation film 1.4 serves also as a tunnel insulation film which is a transfer path for transferring a charge (electrons) from the floating gate electrode 1.3 to the semiconductor substrate 1.1 and the source-drain diffusion layer 1.7.

On a surface of the floating gate electrode 1.3, an inter-poly insulation film 1.5 is formed. The inter-poly insulation film 1.5 contains an oxide film formed by the oxidation of the floating gate electrode (for example, polysilicon) 1.3. A control gate electrode (word line) 1.5 is formed on the inter-poly insulation film 1.5.

A memory cell of the above-described non-volatile semiconductor memory device stores a data piece ("1" or "0") on the basis of the charge (amount of electrons) in the floating gate electrode 1.3. For example, in the case where the floating gate electrode is negatively charged (e.g. "1") and the threshold voltage of the memory cell (transistor) is high, even if a predetermined potential is applied to a floating gate electrode 1.3, the memory cell is not turned on. Contrarily, in the case where the floating gate electrode is positively charged (e.g. "0") and the threshold voltage of the memory cell (transistor) is low, the memory cell is turned on when the same potential is applied.

In order to rewrite data, that is, to store a charge on the floating gate electrode 1, or extract the charge therefrom, it is necessary to change the potential of the floating gate electrode 1.3.

The potential of the floating gate electrode 1.3 is determined on the basis of, for example, the potential applied to the control gate electrode 1.6, and the electrostatic capacity between the floating gate electrode 1.3 and the control gate electrode 1.6.

In order to increase the potential of the floating gate electrode 1.3 with a smallest possible potential of the control gate electrode 1.6, the electrostatic capacity between the floating gate electrode 1.3 and the control gate electrode 1.6 should be set as high as possible.

In the conventional memory cell, the control gate electrode 1.6 is provided such as to cover, in addition to the upper surface of the floating gate electrode 1.3, also two lateral surfaces of the floating gate electrode 1.3, which are located along the direction in which the control gate electrode (word line) 1.6 extends.

More specifically, the area in which the floating gate electrode 1.3 and the control gate 1.6 face with each other is increased to increase the electrostatic capacity between the floating gate electrode 1.3 and the control gate electrode 1.6.

FIG. 4 illustrates a step of the conventional method of manufacturing a non-volatile semiconductor memory device. FIG. 5 is a cross sectional view taken along the line V—V in FIG. 4, and FIG. 6 is a cross sectional view taken along the line V—V in FIG. 4.

First, a groove is made in a p-type semiconductor substrate 1.1, and the grooves is filled with an insulation film, thus forming an element separation insulation film 1.2 having an STI structure. An element region 1.9 is defined in the region surrounded by the element separation insulation film 1.2. A silicon oxide film 1.4A is formed on the element region 1.9.

Next, a polysilicon film 1.3A is formed on an entire surface of the semiconductor substrate 1.1 by the CVD method. An n-type impurity is introduced into the polysilicon film 1.3A during or after the formation of the polysilicon film 1.3A.

Then, a slit-like opening 1.8 is made at a predetermined section of the polysilicon film 13A on the element separation insulation film 1.2.

Next, a silicon oxide film 1.5A is formed on each of the upper surface of the polysilicon film 1.3, and the portions of lateral surfaces thereof, which are situated in the opening 1.8.

Subsequently, a polysilicon film 1.6A is formed on the silicon oxide film 1.5A and on the portion of the element separation insulation film 1.2, which is located in the opening 1.8, by the CVD method. To the polysilicon film 1.6A, an n-type impurity is introduced during or after the formation of the film.

Next, a line-like resist film 2.0 is formed by the photolithographic technique such that it crosses over the opening 1.8. With use of the resist film 2.0 as a mask, the polysilicon film 1.6A, the silicon oxide film 1.5A, the polysilicon film 1.3A and the silicon oxide film 1.4A are etched, thus forming a floating gate electrode and a control gate electrode.

Next, with use of the floating gate electrode and the control gate electrode as a mask, an n-type impurity is introduced into the element region by the self-alignment, thus forming a source-drain diffusion layer.

Thus, a memory cell of a non-volatile semiconductor memory device is completed.

In the memory cell of the conventional non-volatile semiconductor memory device, as shown in FIG. 3, lateral sides of the floating gate electrode 1.3, situated in the direction in which the bit line extends (that is, the column direction) are not covered by the control gate electrode 1.6.

This is because the floating gate electrode 1.3 and the control gate electrode 1.6 are formed at the same time, as described above in the manufacturing method.

Therefore, with the conventional technique, it is not possible to fully increase the electrostatic capacity between the floating gate electrode 1.3 and the control gate electrode 1.6.

Further, in the conventional manufacturing method, as shown in FIG. 7, after the formation of the floating gate electrode 1.3 and the control gate electrode 1.6, the silicon oxide film 2.1 is formed on each of the lateral surfaces of the floating gate electrode 1.3, which is situated in the source-drain diffusion layer 1.7, and the upper and lateral surfaces of the control gate electrode 1.6, by heat oxidation method.

At the same time, the edge portion of the upper surface of the floating gate electrode 1.3, and the edge portion of the lower surface of the control gate electrode 1.6 are oxidized to have the shape of a bird's beak.

In general, the oxidation of these edge portions causes a decrease or a variation in the electrostatic capacity between the floating gate electrode 1.3 and the control gate electrode 1.6, and therefore it should really be prevented.

However, in some cases, depending on the size of the element, the edge portion of the lower surface of the floating gate electrode 1.3 should preferably be oxidized actively, in order to enhance the withstand voltage between the floating gate electrode 1.3 and the source-drain diffusion layer 1.7.

SUMMARY OF THE INVENTION

The present invention has been proposed as a solution to the above-described drawback of the conventional technique, and the object thereof is to provide a non-volatile semiconductor memory device exhibiting an increased and stable electrostatic capacity between the floating gate electrode and the control gate electrode, and a method of manufacturing such a device.

In order to achieve the object, the non-volatile semiconductor memory device of the present invention includes: a semiconductor substrate; an element separation film formed on the semiconductor substrate; a source-drain diffusion layer formed in an element region surrounded by the element separation film; a floating gate electrode formed, via a gate insulation film, on a channel region formed between the source-drain diffusion layers; a control gate electrode which covers at least an upper surface of the floating gate electrode and an upper portion of lateral surfaces of the floating gate electrode, which are located on the source-drain diffusion layer side, but does not cover an lower portion of the lateral surfaces of the floating gate electrode, which are located on the source-drain diffusion layer side; and an interlayer insulation film formed between the floating gate electrode and the control gate electrode.

As an embodiment, the control gate electrode covers the portions of the lateral surfaces of the floating gate electrode, which are located above the bottom surface of the floating gate electrode.

As another embodiment, the device includes an interlayer insulation film which covers the lower portions of the lateral surfaces of the floating gate electrode, which are located on the source-drain diffusion layer side, and the lateral surfaces of the control gate electrode, and the upper surface of the control gate electrode and the upper surface of the interlayer insulation film are made flat and substantially leveled with each other.

The method of manufacturing a non-volatile semiconductor memory device, according to the present invention, includes a series of steps of: forming an element separation film of a first-conductivity type semiconductor substrate; forming a floating gate electrode, via a gate insulation film, on an element region surrounded by the element separation film; implanting a second-conductivity type impurity to the element region; forming an interlayer insulation film which completely covers the floating gate electrode; making a groove in the interlayer insulation film such as to expose at least the upper surface of the floating gate electrode and the upper portions of the lateral surfaces of the floating gate electrode, which are situated on the source-drain diffusion layer side; and forming an inter-layer insulation film on at least the upper surface of the floating gate electrode and the upper portions of the lateral surfaces of the floating gate electrode, which are situated on the source-drain diffusion layer side; and forming a control gate electrode in the groove.

As an embodiment, the groove is formed such that the level of the bottom surface thereof is located higher than the level of the bottom surface of the floating gate electrode.

As another embodiment, the control gate electrode is formed by forming a conductive film on the inter-layer insulation film to completely fill the groove, followed by polishing the conductive film by the CMP method.

As another embodiment, the impurity implanted in the element region is thermally diffused, so as to form a source-drain diffusion layer.

The non-volatile semiconductor memory device of the present invention includes: a semiconductor substrate; an element separation film formed on the semiconductor substrate; a source-drain diffusion layer formed in an element region surrounded by the element separation film; a floating gate electrode formed, via a gate insulation film, on a channel region formed between the source-drain diffusion layers; a control gate electrode which covers at least an upper surface of the floating gate electrode and upper portions of lateral surfaces of the floating gate electrode, which are located on the source-drain diffusion layer side, but does not cover lower portions of the lateral surfaces of the floating gate electrode, which are located on the source-drain diffusion layer side; an inter-layer insulation film formed between the floating gate electrode and the control gate electrode; and a first interlayer insulation film which covers lower portions of the lateral surfaces of the floating gate electrode, which are situated on the source-drain diffusion layer side.

As an embodiment, the first interlayer insulation film is thicker than at least the gate insulation film, and the control gate electrode covers at least the portions of the lateral surfaces of the floating gate electrode, which are situated above the bottom surface of the floating gate electrode.

As another embodiment, the device may further comprise a second interlayer insulation film formed on the first interlayer insulation film, which covers the lateral surfaces of the control gate electrode, and has an etching selective ratio to the first interlayer insulation film.

It is possible that the first interlayer insulation film is made of a silicon oxide film, and an edge portion of the lower surface of the floating gate electrode is oxidized. The first interlayer insulation film is made of a plurality of insulation films including at least silicon oxide film, and the edge portion of the lower surface of the floating gate electrode is oxidized.

It is possible that the first interlayer insulation film is made of a silicon nitride film, and the second interlayer insulation film is made of a silicon oxide film.

As still another embodiment, the device may further include a low-resistance material formed on the control gate electrode, and a second interlayer insulation film, formed on the first interlayer insulation film, for covering lateral surfaces of the control gate electrode and lateral surfaces of the low-resistance material, and the upper surface of the low-resistance material and the upper surface of the interlayer insulation film are made flat and substantially leveled with each other.

According to the present invention, there is also provided a method of manufacturing a non-volatile semiconductor memory device, including the steps of: forming an element separation film on a first-conductivity type semiconductor substrate; forming a first insulation film on the semiconductor substrate; forming a second insulation film having an etching selection ratio with respect to the first insulation film, on the insulation film; making an opening in the first and second insulation films at a position above an element separation region surrounded by the element separation film; forming a gate insulation film which is than at least the first insulation film, on a bottom surface of the opening; forming a floating gate electrode only in the opening; forming a third insulation film on the second insulation film and the floating gate electrode; making a groove, a bottom surface is leveled with the upper surface of the first insulation film, in the second and third insulation films such as to expose at least an upper surface of the floating gate electrode and upper portions of lateral surfaces of the floating gate electrode, which are situated on the source-drain diffusion layer side; forming an interlayer insulation film on at least the upper surface of the floating gate electrode, and the upper portions of the lateral surfaces of the floating gate electrode, which are situated on the source-drain diffusion layer side; and forming a control gate electrode in the groove.

As another embodiment of the above, it is possible that in the manufacturing method, the first insulation film is a silicon nitride film, and the second insulation film is a silicon oxide film.

As still another embodiment of the above, it is possible that in the manufacturing method, the first insulation film is made of a plurality of films including at least a silicon oxide film, and an edge portion of a lower surface of the floating gate electrode is oxidized.

As still another embodiment of the above, it is possible that the manufacturing method further includes the step of forming a fourth insulation film containing an impurity of a second-conductivity type, before forming the insulation film, and making the opening in the fourth insulation film, and the step of forming a source-drain diffusion layer by diffusing the impurity contained in the fourth insulation film to the semiconductor substrate by a heating step carried out after making the opening.

As still another embodiment of the above, it is possible that in the manufacturing method, the floating gate electrode is formed by forming a conductive film on the second insulation film such as to completely fill the opening, followed by polishing the conductive film by a CMP method.

As another embodiment of the above, it is possible that in the manufacturing method, the control gate electrode is formed by forming a conductive film on the third insulation film such as to completely fill the groove, followed by polishing the conductive film by a CMP method.

As still another embodiment of the above, it is possible that in the manufacturing method, the control gate electrode is formed in the groove such that a level of the upper surface of the control gate electrode is located lower than a level of an upper surface of the third insulation film, and a low-resistance material which fills the groove, is formed in the groove.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The non-volatile semiconductor memory device according to the present invention, and the method of manufacturing such a device, will now be described in detail with reference to accompanying drawings.

Figure 1:
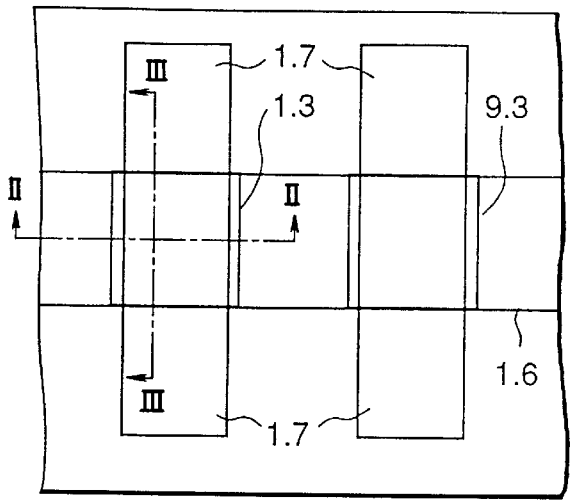
FIG. 1 is a plan view showing a conventional non-volatile semiconductor memory device.
Figures 2, 3:
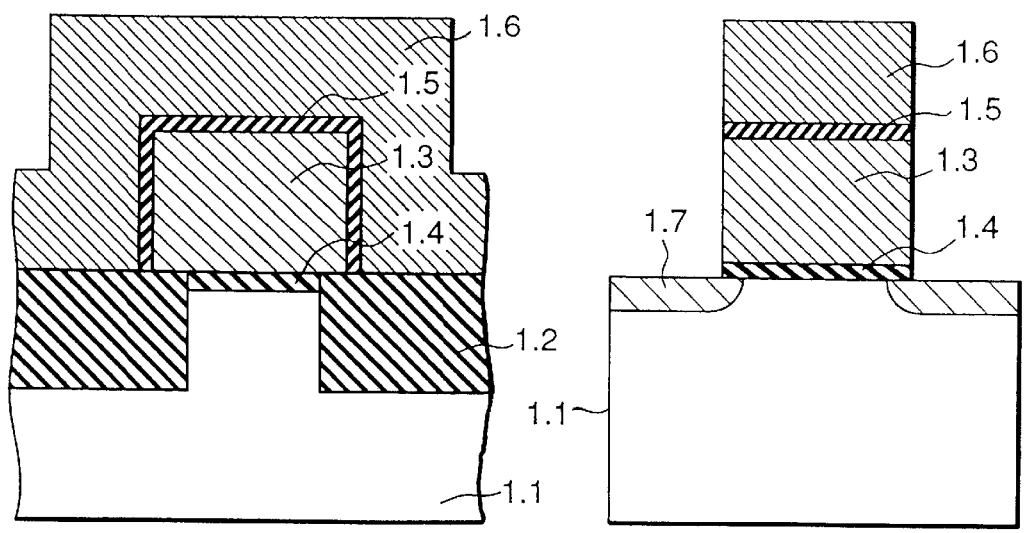
FIG. 2 is a cross sectional view taken along the line II—II in FIG. 1.
FIG. 3 is a cross sectional view taken along the line III—III in FIG. 1.
Figure 4:
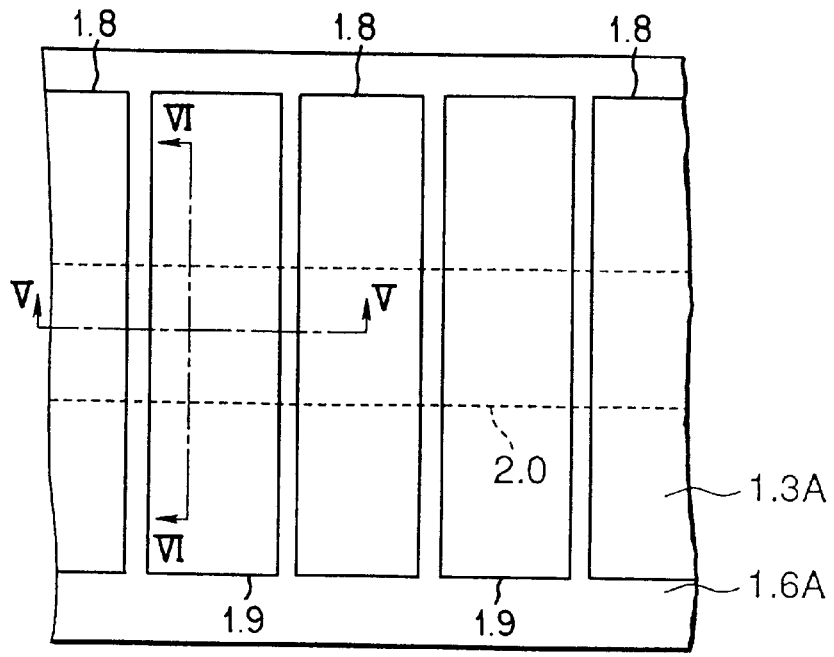
FIG. 4 is a plan view showing a step of a conventional manufacturing method.
Figure 5:
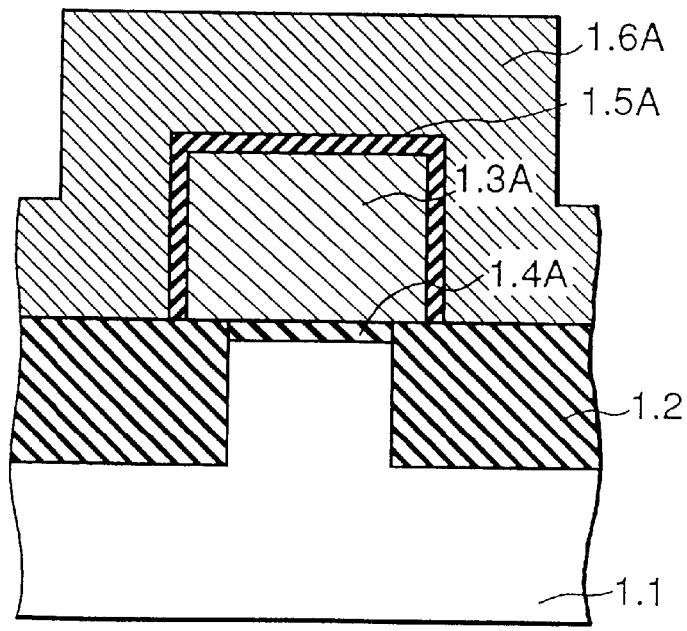
FIG. 5 is a cross sectional view taken along the line V—V in FIG. 4.
Figure 6:
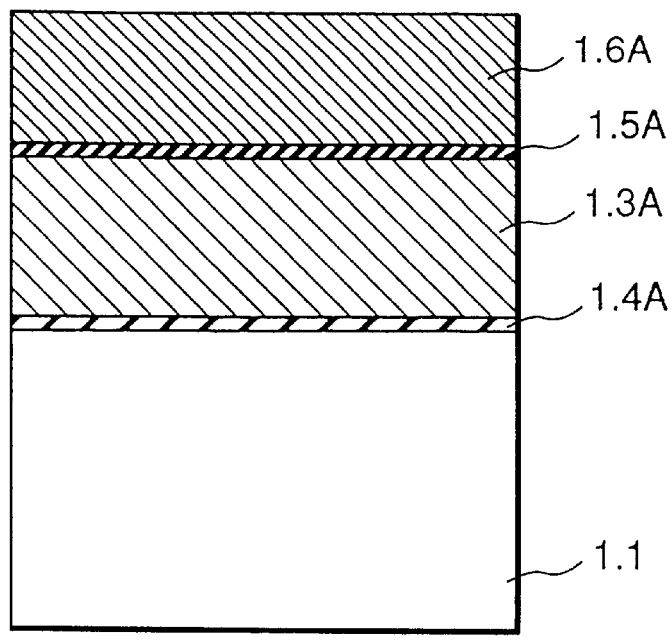
FIG. 6 is a cross sectional view taken along line VI—VI in FIG. 4.
Figure 7:
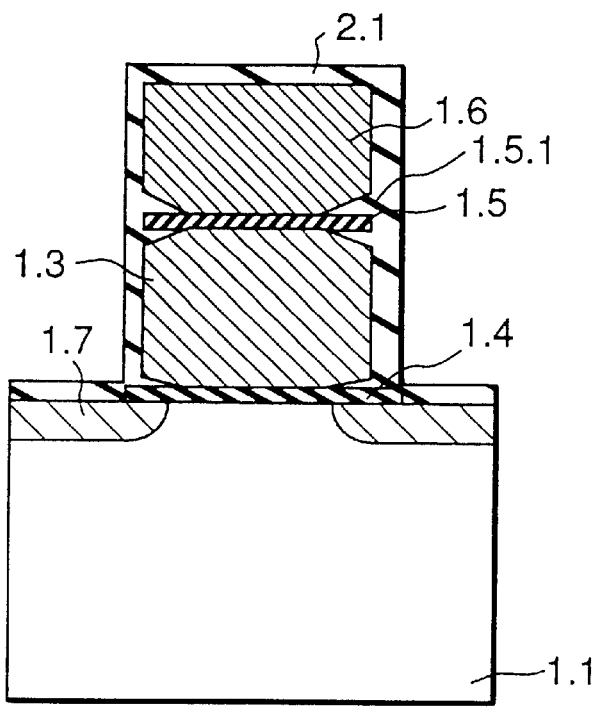
FIG. 7 is a cross sectional view showing the conventional non-volatile semiconductor memory device.
Figure 8:
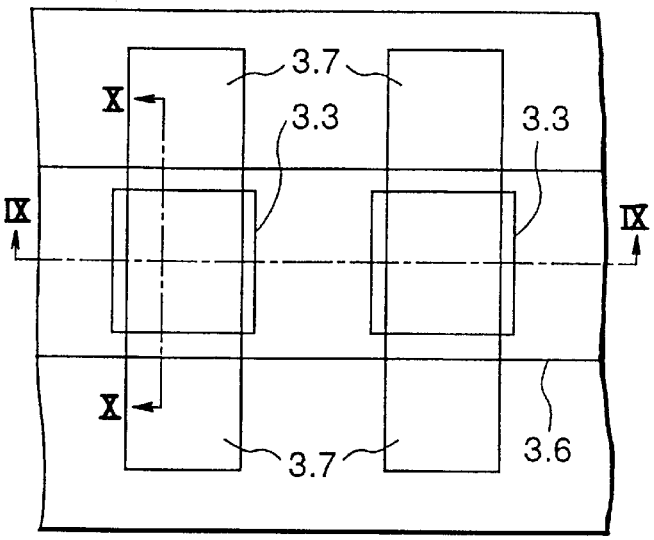
FIG. 8 is a plan view showing a first embodiment of the non-volatile semiconductor memory device according to the present invention.
Figure 9:
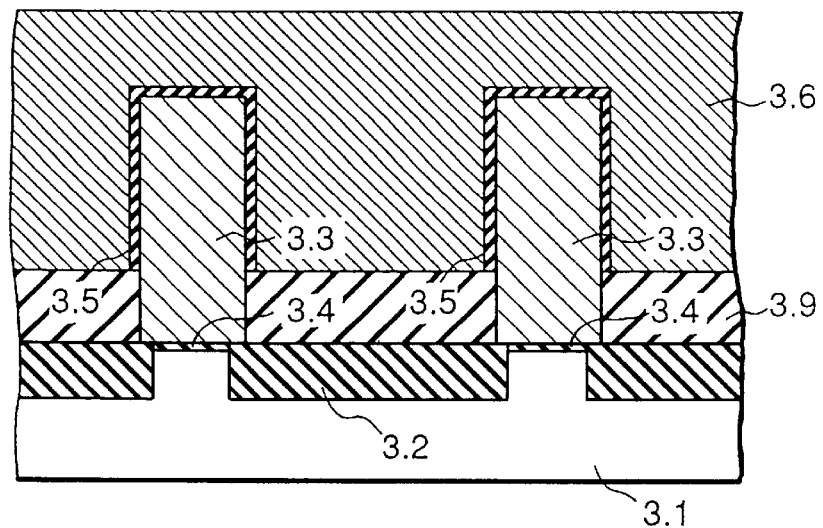
FIG. 9 is a cross sectional view taken along the line IX—IX in FIG. 8.
Figure 10:
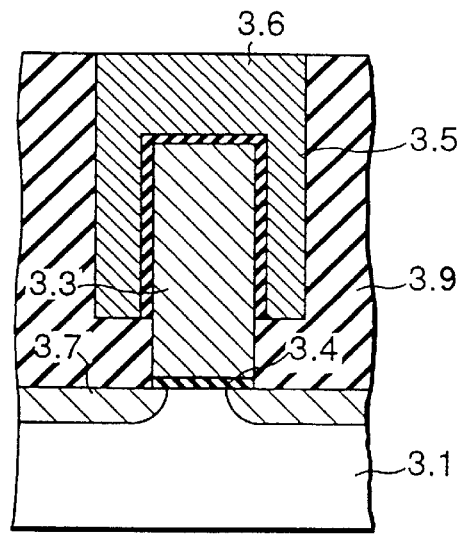
FIG. 10 is a cross sectional view taken along the line X—X in FIG. 9.

FIG. 8 is a diagram showing a first embodiment of the non-volatile semiconductor memory device according to the present invention. FIG. 9 is a cross section taken along the line IX—IX in FIG. 8, and FIG. 10 is a cross section taken along the line X—X in FIG. 8.

A p-type semiconductor substrate 3.1 has a narrow groove for element separation, formed in the substrate, and the groove is filled with an insulation film 3.2 (that is, the STI structure).

In an element region surrounded by the insulation film 3.2, an n-type source-drain diffusion layer 3.7 is formed. On a channel region between the source-drain diffusion layer 3.7, a floating gate electrode 3.3 is formed via a gate insulation film 3.4. The gate insulation film 3.4 serves also as a tunnel insulation film which is a transfer path for transferring a charge (electrons) from the floating gate electrode 3.3 to the semiconductor substrate 3.1 or the source-drain diffusion layer 3.7.

On a surface of the floating gate electrode 3.3, an inter-poly insulation film 3.5 is formed. A control gate electrode (word line) 3.6 is formed on the inter-poly insulation film 3.5 such as to cover the upper and lateral surfaces of the floating gate electrode 3.3.

However, the lower portions of the lateral surfaces of the floating gate electrode 3.3 is covered not by the control gate electrode 3.6, but by the interlayer insulation film 3.9.

The features of the memory cell of the non-volatile semiconductor memory device will now be described in detail.

First, two lateral surfaces of the floating gate electrode 3.3, which are situated in the (row) direction in which the control gate electrode 3.6 extends, and two lateral surfaces of the floating gate electrode 3.3, which are situated in the (column) direction in which the bit line extends, are each covered by the control gate electrode 3.6.

With this structure of the present invention, the region where the floating gate electrode 3.3 and the control gate electrode 3.6 face with each other, can be increased as compared to the conventional memory cell, and therefore the electrostatic capacitance between the floating gate electrode 3.3 and the control gate electrode 3.6 can be increased.

Second, the lower portions of the lateral surfaces of the floating gate electrode 3.3 are not covered by the control gate electrode 3.6, but by the interlayer insulation film 3.9.

That is, as the lower portions of the lateral surfaces of the floating gate electrode 3.3 are covered by the interlayer insulation film 3.9, the thick interlayer insulation film 3.9 is present between the control gate electrode 3.6 and the source-drain diffusion layer 3.7. With this structure, the withstand voltage between the control gate electrode 3.6 and the source-drain diffusion layer can be improved.

Further, since the edge portion of the upper surface of the floating gate electrode 3.3 is covered by the control gate electrode 3.6, the edge portion is not oxidized. Thus, the variation in the capacitance between the floating gate electrode 3.3 and the control gate 3.6 can be prevented.

Furthermore, when the interlayer insulation film 3.9 is made of a silicon oxide film or a film which can transmit oxygen, the edge portion of the lower surface of the floating gate electrode 3.3 can be oxidized when necessary.

Third, the upper surface of the control gate electrode 3.6 is made flat. That is, when the upper surface of the control gate electrode 3.6 is made flat, the multiplexing of the wire layer or the yield of the product can be improved.

The method of manufacturing a non-volatile semiconductor memory device illustrated in FIGS. 8 to 10 will now be described.

Figure 11:
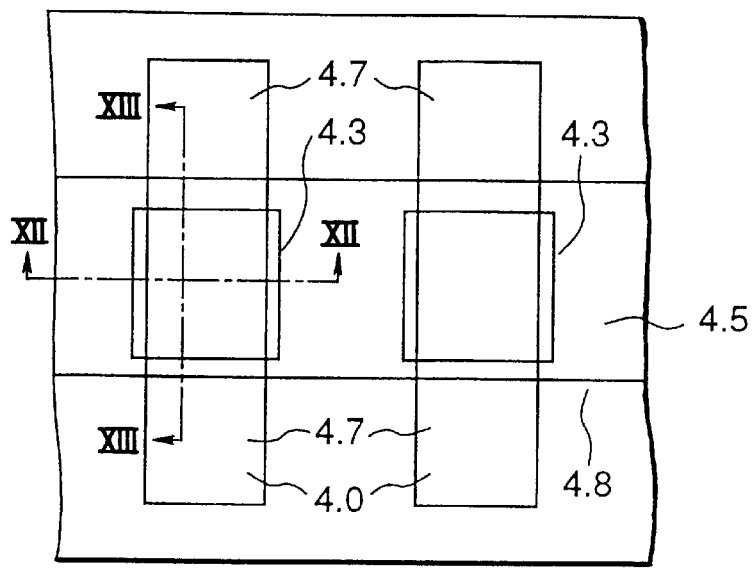
FIG. 11 is a plan view showing a step of the manufacturing method according to the present invention.
Figures 12, 13:
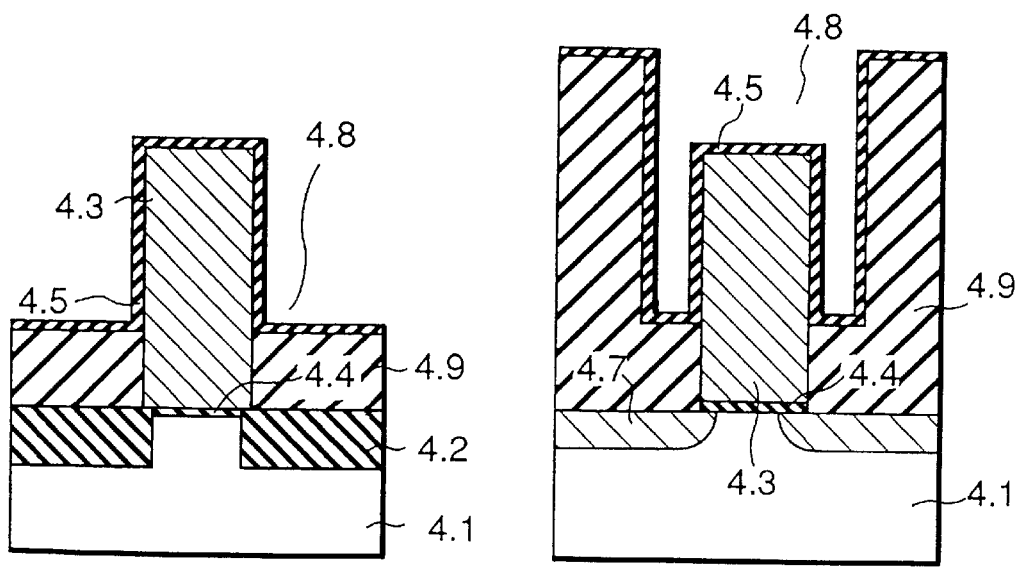
FIG. 12 is a cross sectional view taken along the line XII—XII in FIG. 11.
FIG. 13 is a cross sectional view taken along the line XII—XII in FIG. 11.

First, as can be seen in FIGS. 11 to 13, a groove is made in a p-type semiconductor substrate 4.1, and the grooves are filled with an insulation film, thus forming an element separation insulation film 4.2 having an STI structure. An element region 4.0 is defined in the region surrounded by the element separation insulation film 4.2. A silicon oxide film 4.4 is formed on the element region 4.0.

Next, a polysilicon film is formed on an entire surface of the semiconductor substrate 4.1 by the CVD method. An n-type impurity or a p-type impurity is introduced into the polysilicon film during or after the formation of the polysilicon film. Then, the polysilicon film is processed to form a floating gate electrode 4.3.

After that, with use of the floating gate electrode 4.3 as a mask, an n-type impurity is implanted by the ion implantation method, to the element region 4.0 of the semiconductor substrate 4.1, thus forming a source-drain diffusion layer 4.7. The source-drain diffusion layer 4.7 may be formed by diffusion (that is, for example, the diffusion of the n-type impurity from the polysilicon film to the semiconductor substrate).

Subsequently, an interlayer insulation film (for example, a silicon oxide film) 4.9 is formed on the semiconductor substrate 4.1 such as to completely cover the floating gate electrode 4.3. Further, a resist pattern is formed by the photolithographic technique, and with use of the resist pattern as a mask, the interlayer insulation film 4.9 is etched to make a groove 4.8 having its length in the row direction, to cross over a plurality of floating gate electrodes 4.3 arranged in the row direction.

For the etching of the interlayer insulation film 4.9, there is one condition, that is, the bottom of the groove 4.8 does not reach the surface of the semiconductor substrate 4.1 or the surface of the element separation insulation film 4.2. In other words, it is necessary that the bottom of the groove 4.8 should be situated at a level higher than, at least, the lower surface of the floating gate electrode 4.3.

There is another condition, that is, the width of the groove 4.8 should be larger than that of the floating gate electrode 4.3.

When these conditions are satisfied, the upper surface of the floating gate electrode 4.3 and the upper portion of the lateral surfaces of the floating gate electrode 4.3 are exposed in the groove 4.8.

After that, an inter-poly insulation film 4.5 is formed on the interlayer insulation film 4.9 and the floating gate electrode 4.3. The inter-poly insulation film 4.5 has a structure in which, for example, a silicon oxide film ($SiO_2$), a silicon nitride film ($Si_3N_4$) and a silicon oxide film ($SiO_2$) are laminated together.

Figure 14:
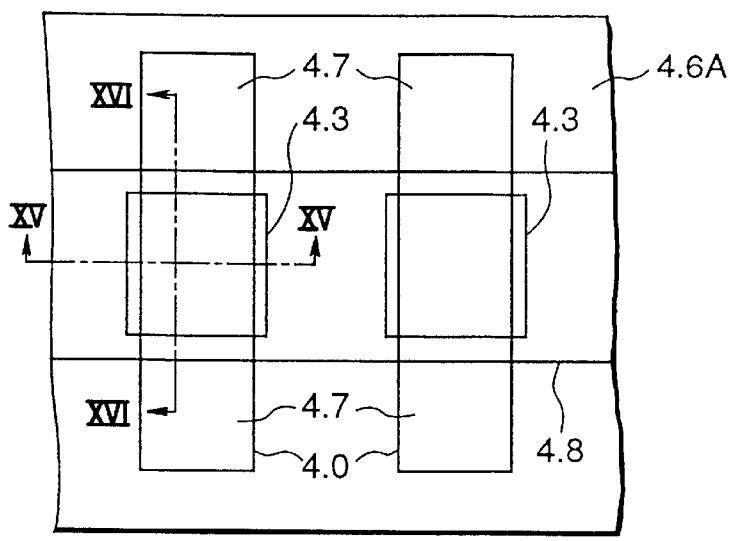
FIG. 14 is a plan view showing a step of the manufacturing method according to the present invention.
Figures 15, 16:
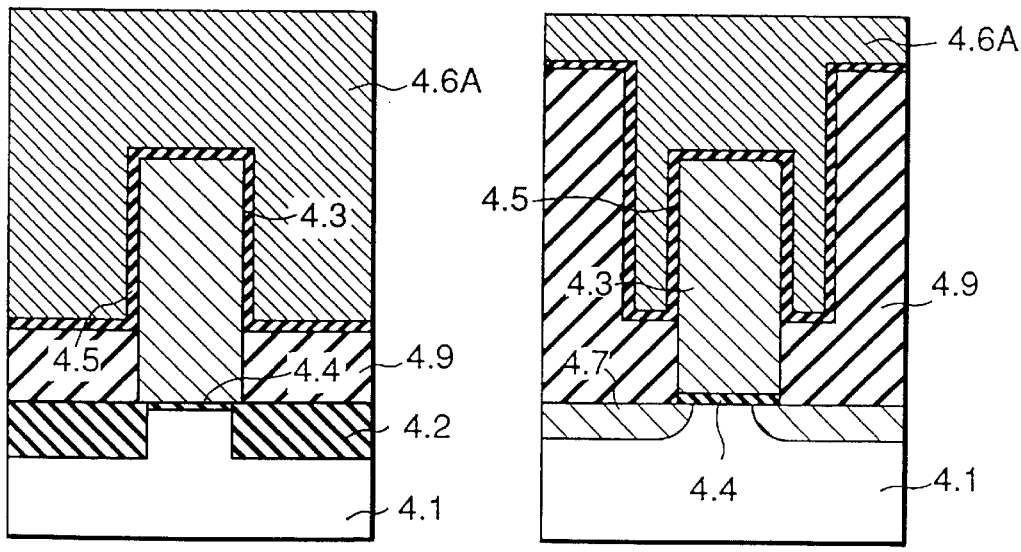
FIG. 15 is a cross sectional view taken along the line XV—XV in FIG. 14.
FIG. 16 is a cross sectional view taken along the line XVI—XVI in FIG. 14.

Next, as shown in FIGS. 14 to 16, a polysilicon film 4.6A is formed on the inter-poly insulation film 4.5 by the CVD method. To the polysilicon film 4.6A, an n-type impurity is introduced during or after the formation of the polysilicon film.

Figure 17:
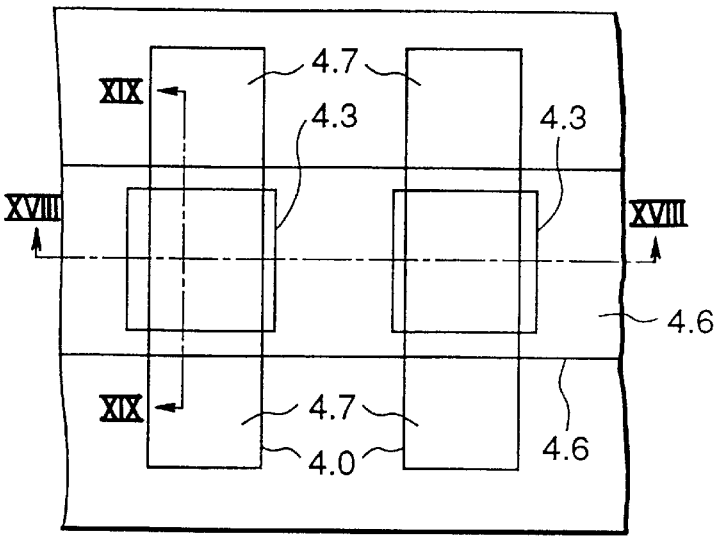
FIG. 17 is a plan view showing a step of the manufacturing method according to the present invention.
Figure 18:
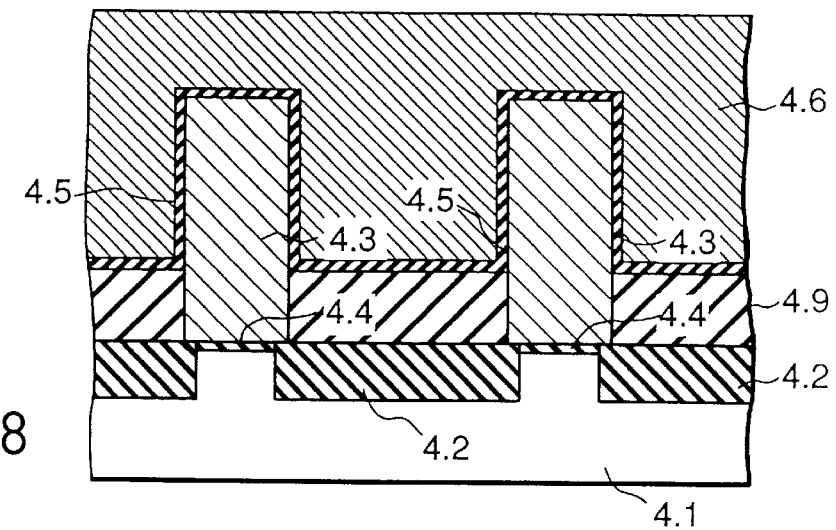
FIG. 18 is a cross sectional view taken along the line XVIII—XVIII in FIG. 17.
Figure 19:
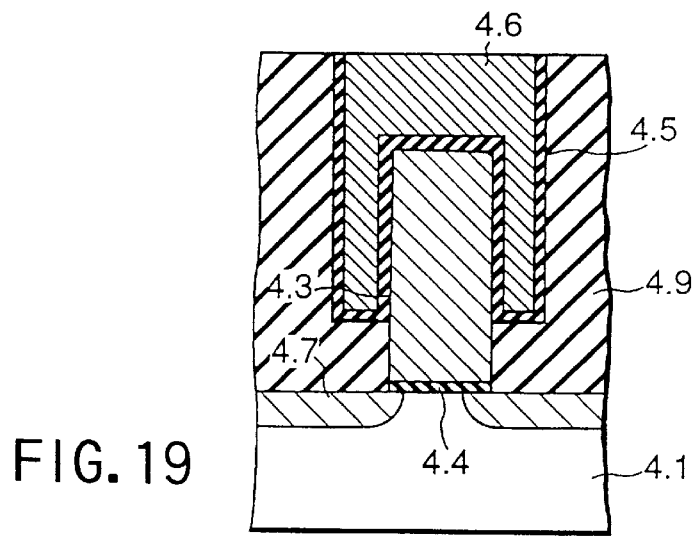
FIG. 19 is a cross sectional view taken along the line XIX—XIX in FIG. 17.

Then, as can be seen in FIGS. 17 to 19, the polysilicon film is polished by a CMP (chemical mechanical polishing) method, so as to leave the polysilicon only in the groove 4.8. As a result, in the groove 4.8, a control gate electrode 4.6 having a flat upper surface is formed.

After the completion of the CMP, the level of the upper surface of the control gate electrode 4.6 is substantially equal to the level of the upper surface of the interlayer insulation film 4.9.

Thus, a memory cell of the non-volatile semiconductor memory device is completed.

Figure 20:
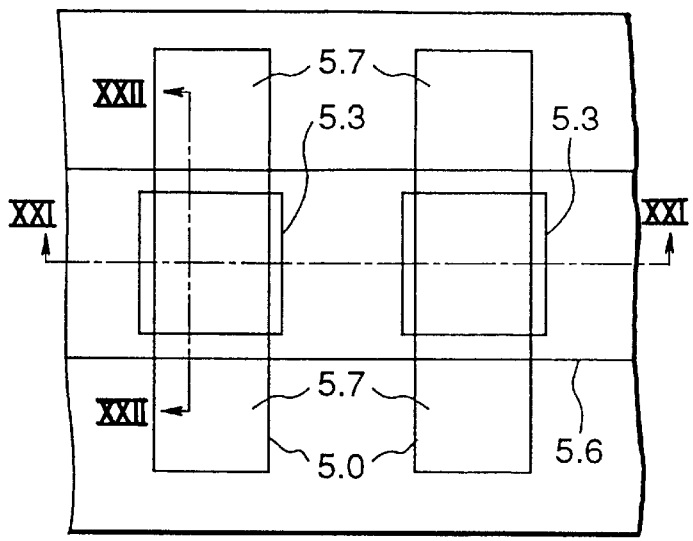
FIG. 20 is a plan view showing a second embodiment of the non-volatile semiconductor memory device according to the present invention.
Figure 21:
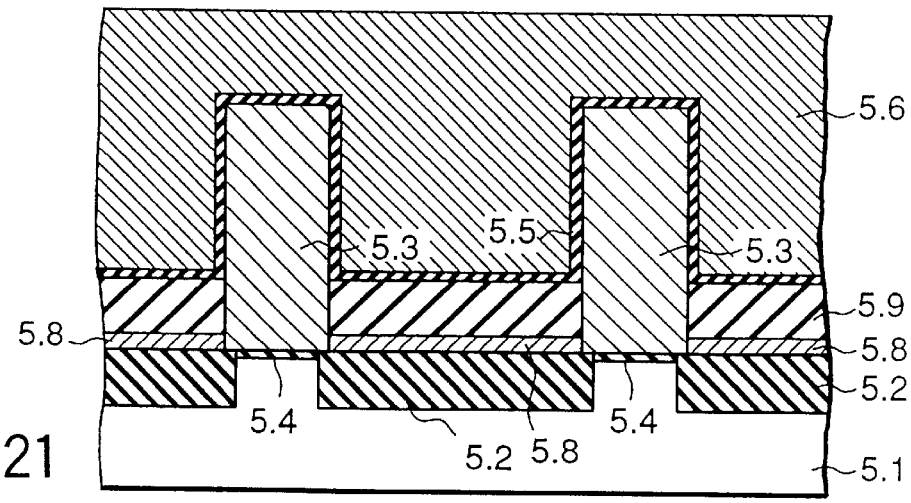
FIG. 21 is a cross sectional view taken along the line XXI—XXI in FIG. 20.
Figure 22:
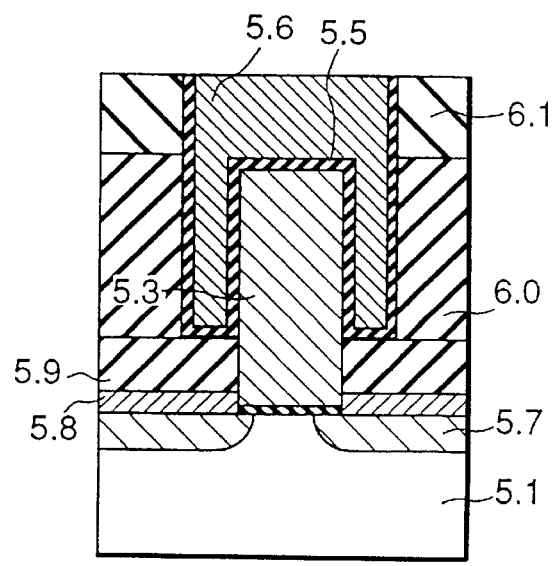
FIG. 22 is a cross sectional view taken along the line XXII—XXII in FIG. 20.

FIG. 20 is a diagram showing a second embodiment of the non-volatile semiconductor memory device according to the present invention. FIG. 21 is a cross section taken along the line XXI—XXI in FIG. 20, and FIG. 22 is a cross section taken along the line XXII—XXII in FIG. 20.

A p-type semiconductor substrate 5.1 has a narrow groove for element separation, formed in the substrate, and the groove is filled with an insulation film 5.2 (that is, the STI structure).

In an element region 5.0 surrounded by the insulation film 5.2, an n-type source-drain diffusion layer 5.7 is formed. On the source-drain diffusion layer 5.7, a insulation film 5.8 containing impurities, that is, for example, a PSG film or AsSG film, for forming the source-drain diffusion layer 5.7, is formed.

The insulation film 5.8 is necessary for the case where the source-drain diffusion layer 5.7 is formed by thermal diffusion, and this film 5.8 may not be present when the source-drain diffusion layer 5.7 is formed by, for example, the ion implantation.

On a channel region between the source-drain diffusion layer 5.7, a floating gate electrode 5.3 is formed via a gate insulation film 5.4. The gate insulation film 5.4 serves also as a tunnel insulation film which is a transfer path for transferring a charge (electrons) from the floating gate electrode 5.3 to the semiconductor substrate 5.1 or to the source-drain diffusion layer 5.7.

On a surface of the floating gate electrode 5.3, an inter-poly insulation film 5.5 is formed. A control gate electrode (word line) 5.6 is formed on the inter-poly insulation film 5.5 such as to cover the upper and lateral surfaces of the floating gate electrode 5.3.

However, the lower portions of the lateral surfaces of the floating gate electrode 5.3 is covered not by the control gate electrode 5.6, but by the insulation film 5.9. The insulation film 5.9 is made of a film which is capable of serving as an etching stopper in etching (RIE), such as a silicon nitride film.

Insulation films (for example, silicon oxide films) 6.0 and 6.1 are formed on the insulation film 5.9 such as to cover the lateral surfaces of the control gate electrode 5.6.

The features of the memory cell of the non-volatile semiconductor memory device will now be described in detail.

First, two lateral surfaces of the floating gate electrode 5.3, which are situated in the (row) direction in which the control gate electrode 5.6 extends, and two lateral surfaces of the floating gate electrode 5.3, which are situated in the (column) direction in which the bit line extends, are each covered by the control gate electrode 5.6.

With this structure of the present invention, the region where the floating gate electrode 5.3 and the control gate electrode 5.6 face with each other, can be increased as compared to the conventional memory cell, and therefore the electrostatic capacitance between the floating gate electrode 5.3 and the control gate electrode 5.6 can be increased.

Second, the lower portions of the lateral surfaces of the floating gate electrode 5.3 are not covered by the control gate electrode 5.6, but by the insulation film 5.9. The insulation film 5.9 has a function of an etching stopper during etching (RIE).

In the presence of the insulation film 5.9, the following effects can be obtained.

That is, since the insulation film 5.9 is present between the control gate electrode 5.6 and the source-drain diffusion layer 5.7, the withstand voltage between the control gate electrode 5.6 and the source-drain diffusion layer 5.7 can be improved.

Further, since the edge portion of the upper surface of the floating gate electrode 5.3 is covered by the control gate electrode 5.6, the edge portion is not oxidized. Thus, the variation in the capacitance between the floating gate electrode 5.3 and the control gate 5.6 can be prevented.

Furthermore, when the insulation film 5.9 is made of a silicon oxide film or a film which can transmit oxygen, the edge portion of the lower surface of the floating gate electrode 5.3 can be oxidized when necessary.

Third, the upper surface of the control gate electrode 3.6 is made flat. That is, when the upper surface of the control gate electrode 5.6 is made flat, the multiplexing of the wire layer or the yield of the product can be improved.

The method of manufacturing a non-volatile semiconductor memory device illustrated in FIGS. 20 to 22 will now be described.

Figure 23:
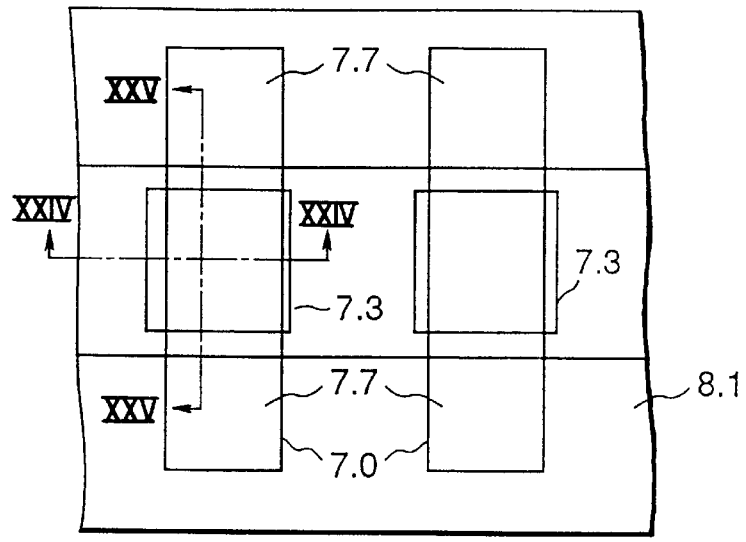
FIG. 23 is a plan view showing a step of the manufacturing method according to the present invention.
Figures 24, 25:
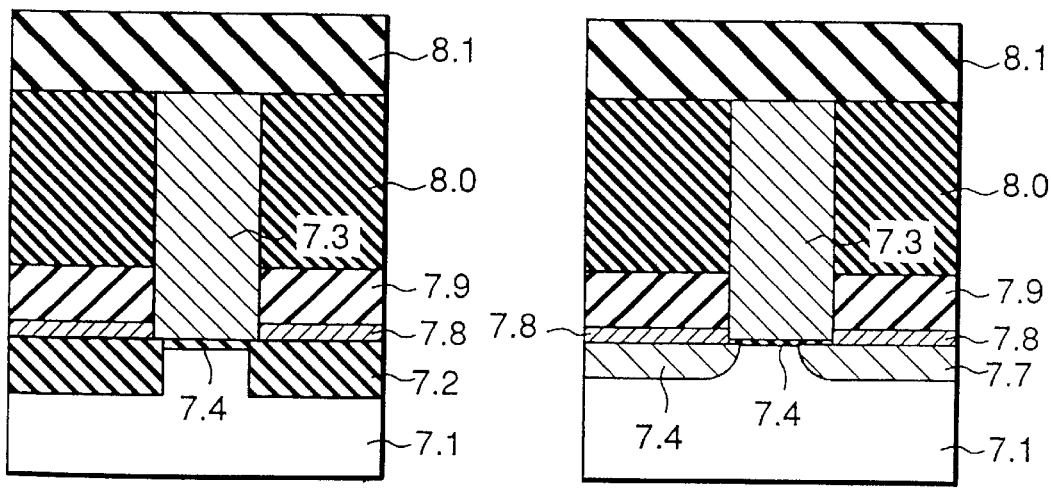
FIG. 24 is a cross sectional view taken along the line XXIV—XXIV in FIG. 23.
FIG. 25 is a cross sectional view taken along the line XXV—XXV in FIG. 23.

First, as can be seen in FIGS. 23 to 25, a groove is made in a p-type semiconductor substrate 7.1, and the grooves are filled with an insulation film, thus forming an element separation insulation film 7.2 having an STI structure. An element region 7.0 is defined in the region surrounded by the element separation insulation film 7.2.

Next, a silicon oxide film containing an n-type impurity, such as a PSG film or AsSG film, is formed on an entire surface of the semiconductor substrate 7.1 by the CVD method. Further, a silicon nitride film 7.9 and a silicon oxide film 8.0 are formed in this order on the silicon oxide film 7.8 by the CVD method.

Further, a resist pattern is formed by the photolithographic technique, and with use of the resist pattern as a mask, the silicon oxide film 8.0, the silicon nitride film 7.9 and the silicon oxide film 7.8 are etched one after another, thus making an opening to expose the element region 7.0.

After that, a silicon oxide film (tunnel oxide film) 7.4 is formed on a bottom of the opening, that is, on the semiconductor substrate 7.1. Then, a polysilicon film which completely fills the opening is formed on the silicon oxide film 8.0. To the polysilicon film, an n-type impurity is introduced during or after the formation of the polysilicon film.

Then, the polysilicon film is polished by the CMP (chemical mechanical polishing) method, so as to leave the polysilicon film only in the opening. Thus, a floating gate electrode 7.3 is formed.

Further, a silicon oxide film 8.1 is formed on the floating gate electrode 7.3 and the silicon oxide film 8.0 by the CVD method.

It should be noted that a source-drain diffusion layer 7.7 is formed by diffusing an impurity from the silicon oxide film 7.8 to the semiconductor substrate 7.1 in a heating step which is carried out before the completion of the manufacture, after the formation of the silicon oxide film 7.8. The heating may be a step for forming the source-drain diffusion layer 7.7, or some other step for a different object.

Figure 26:
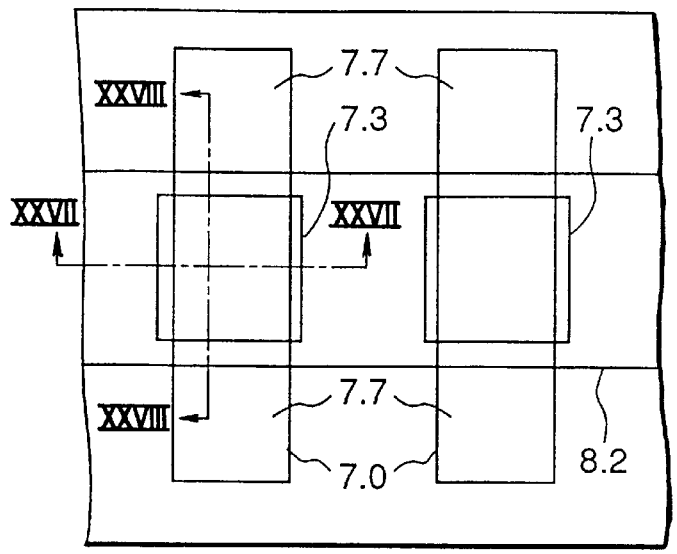
FIG. 26 is a plan view showing a step of the manufacturing method according to the present invention.
Figures 27, 28:
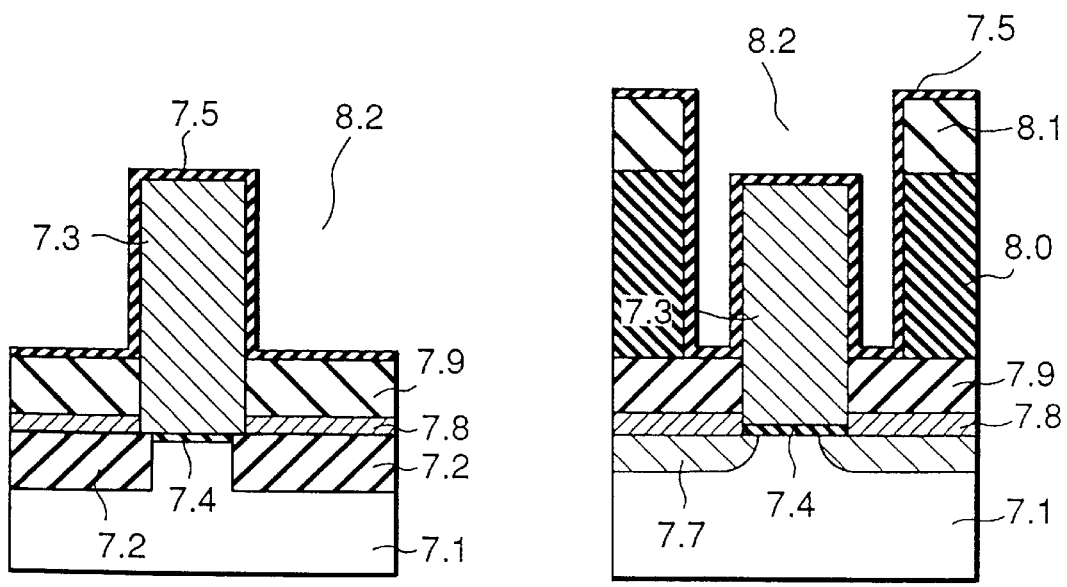
FIG. 27 is a cross sectional view taken along the line XXVII—XXVII in FIG. 26.
FIG. 28 is a cross sectional view taken along the line XXVIII—XXVIII in FIG. 26.

Subsequently, as can be seen in FIGS. 26 to 28, a resist pattern is formed by the photolithographic technique, and with use of the resist pattern as a mask, the silicon oxide films 8.0 and 8.1 are etched to make a groove 8.2 having its length in the row direction, to cross over a plurality of floating gate electrodes 7.3 arranged in the row direction.

For the etching of the silicon oxides films 8.0 and 8.1, an etching method having a high etching selection ratio with respect to the silicon nitride film 7.9, such as RIE, should be employed. With such a method, the etching stops on the surface of the silicon nitride film 7.9, and therefore the level of the bottom of the groove 8.2 can be made higher than that of, at least, the lower surface of the floating gate electrode 7.3.

Further, the width of the groove 8.2 is set larger than that of the floating gate electrode 7.3 in the column direction. With this structure, the upper surface of the floating gate electrode 7.3 and the upper portion of the lateral surfaces of the floating gate electrode 7.3 are exposed in the groove 8.2.

After that, an inter-poly insulation film 7.5 is formed on the silicon nitride film 7.9 and the floating gate electrode 7.3. The inter-poly insulation film 7.5 has a structure in which, for example, a silicon oxide film ($SiO_2$), a silicon nitride film ($Si_3N_4$) and a silicon oxide film ($SiO_2$) are laminated together.

Figure 29:
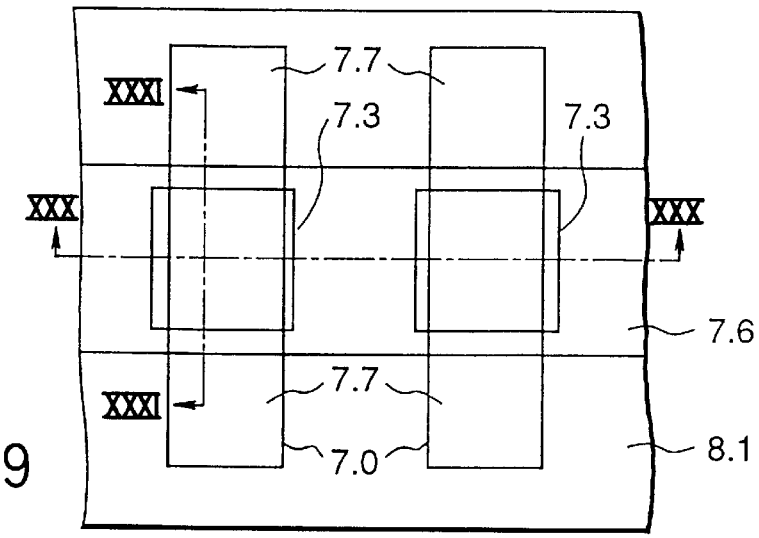
FIG. 29 is a plan view showing a step of the manufacturing method according to the present invention.
Figure 30:
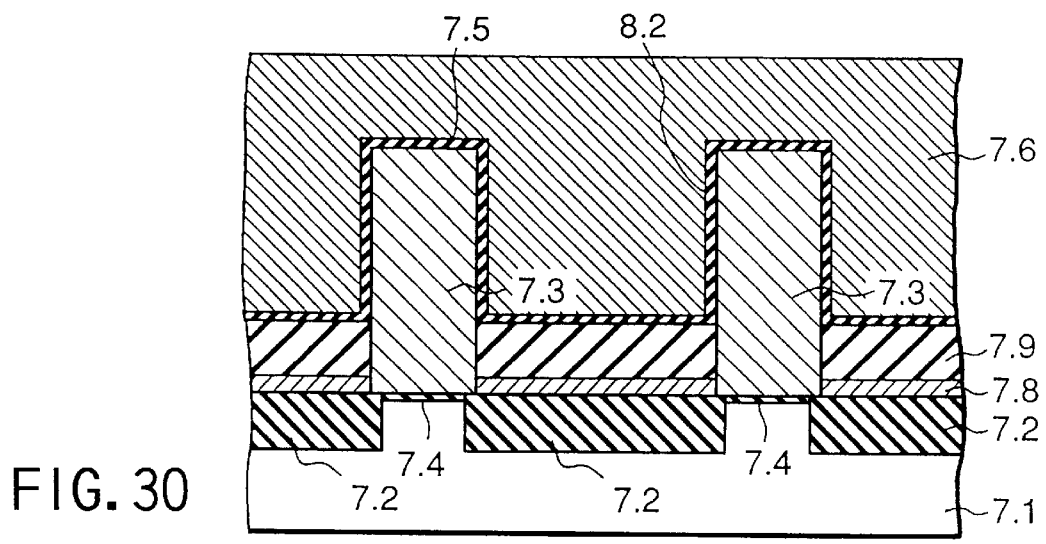
FIG. 30 is a cross sectional view taken along the line XXX—XXX in FIG. 29.
Figure 31:
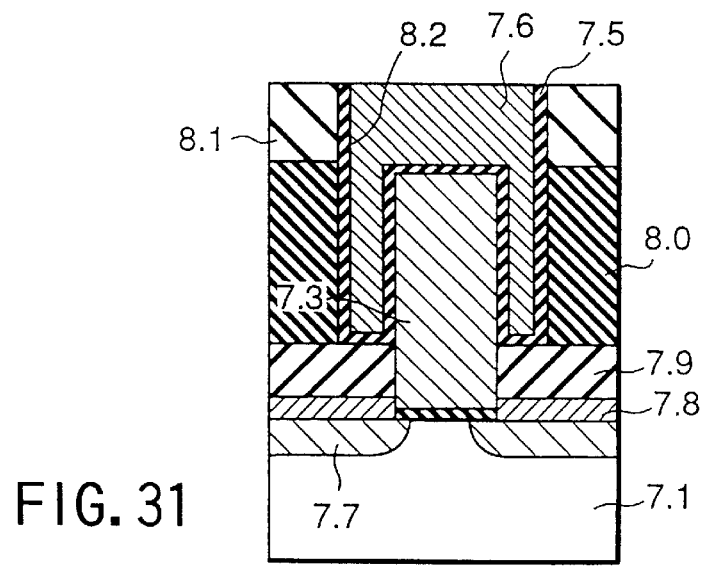
FIG. 31 is a cross sectional view taken along the line XXXI—XXXI in FIG. 29.

Next, as shown in FIGS. 29 to 31, a polysilicon film is formed on the inter-poly insulation film 7.5 by the CVD method. To this polysilicon film, an n-type impurity is introduced during or after the formation of the polysilicon film.

Then, the polysilicon film is polished by a CMP (chemical mechanical polishing) method, so as to leave the polysilicon only in the groove 8.2. As a result, in the groove 8.2, a control gate electrode 7.6 having a flat upper surface is formed.

After the completion of the CMP, the level of the upper surface of the control gate electrode 7.6 is substantially equal to the level of the upper surface of the insulation film 8.1.

Thus, a memory cell of the non-volatile semiconductor memory device is completed.

Figure 32:
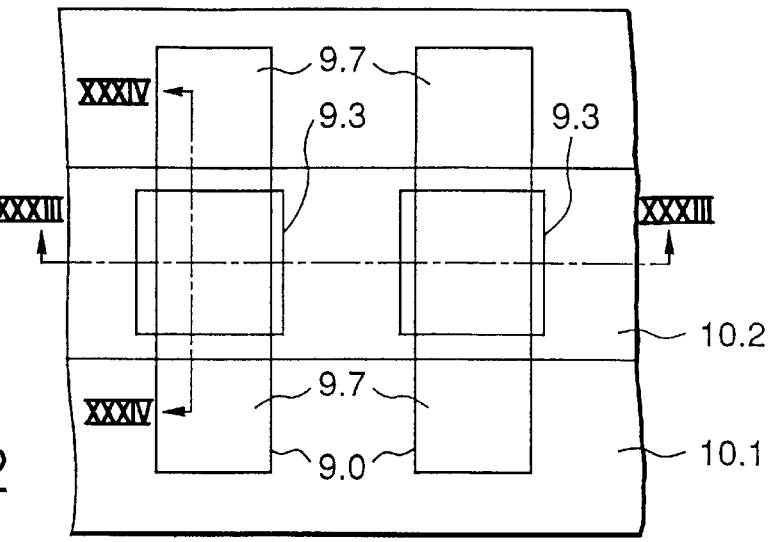
FIG. 32 is a plan view showing a third embodiment of the non-volatile semiconductor memory device according to the present invention.
Figure 33:
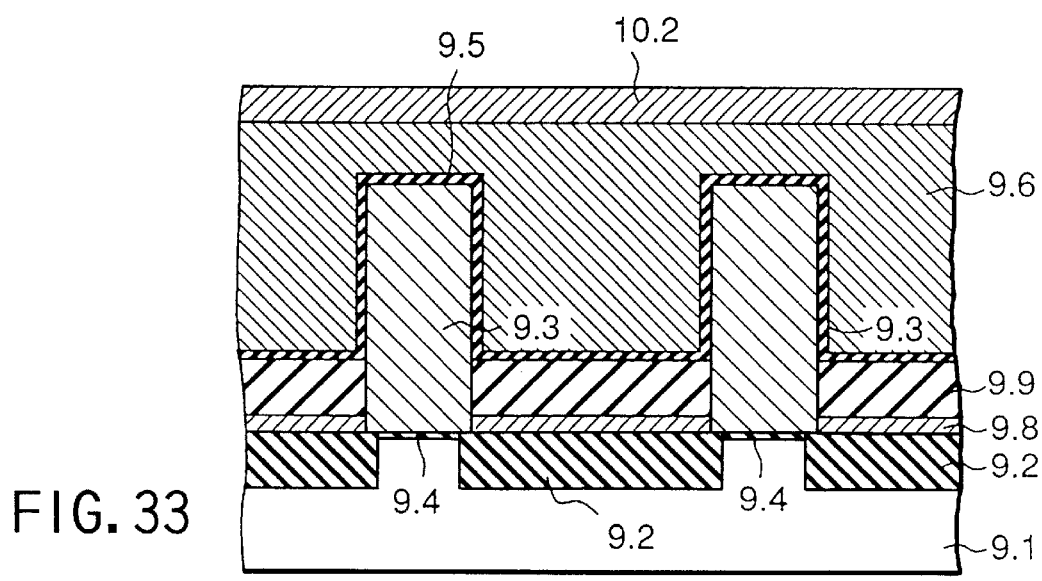
FIG. 33 is a cross sectional view taken along the line XXXIII—XXXIII in FIG. 32.
Figure 34:
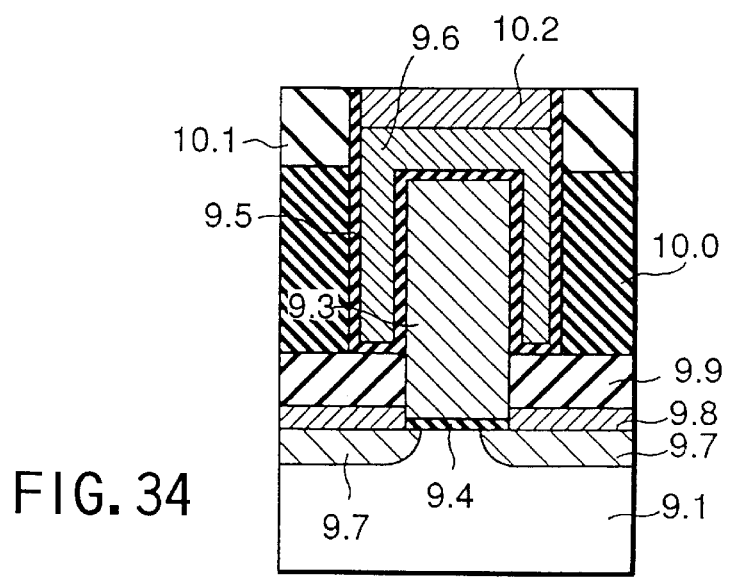
FIG. 34 is a cross sectional view taken along the line XXXIV—XXXIV in FIG. 32.

FIG. 32 is a diagram showing a third embodiment of the non-volatile semiconductor memory device according to the present invention. FIG. 33 is a cross section taken along the line XXXIII—XXXIII in FIG. 32, and FIG. 34 is a cross section taken along the line XXXIV—XXXIV in FIG. 32.

A p-type semiconductor substrate 9.1 has a narrow groove for element separation, formed in the substrate, and the groove is filled with an insulation film 9.2 (that is, the STI structure).

In an element region 9.0 surrounded by the insulation film 9.2, an n-type source-drain diffusion layer 9.7 is formed. On the source-drain diffusion layer 9.7, an insulation film 9.8 containing impurities, that is, for example, a PSG film or AsSG film, for forming the source-drain diffusion layer 9.7, is formed.

It should be noted that the insulation film 9.8 is necessary for the case where the source-drain diffusion layer 9.7 is by thermal diffusion, and this film 9.8 may not be present when the source-drain diffusion layer 9.7 is formed by, for example, the ion implantation.

On a channel region between the source-drain diffusion layer 9.7, a floating gate electrode 9.3 is formed via a gate insulation film 9.4. The gate insulation film 9.4 serves also as a tunnel insulation film which is a transfer path for transferring a charge (electrons) from the floating gate electrode 9.3 to the semiconductor substrate 9.1 or to the source-drain diffusion layer 9.7.

On a surface of the floating gate electrode 9.3, an inter-poly insulation film 9.5 is formed. A control gate electrode (word line) 9.6 is formed on the inter-poly insulation film 9.5 such as to cover the upper and lateral surfaces of the floating gate electrode 9.3. The control gate electrode 9.6 is made of a polysilicon film containing an impurity.

A low-resistance material (such as a refractory metal or a refractory metal silicide) 10.2 is formed on the control gate electrode 9.6.

The lower portions of the lateral surfaces of the floating gate electrode 9.3 are covered not by the control gate electrode 9.6, but by an insulation film 9.9. The insulation film 9.9 is made of a film which is capable of serving as an etching stopper in etching (RIE), such as a silicon nitride film.

Insulation films (for example, silicon oxide films) 10.0 and 10.1 are formed on the insulation film 9.9 such as to cover the lateral surfaces of the control gate electrode 9.6 and the low-resistance material 10.2.

The features of the memory cell of the non-volatile semiconductor memory device will now be described in detail.

First, two lateral surfaces of the floating gate electrode 9.3, which are situated in the (row) direction in which the control gate electrode 9.6 extends, and two lateral surfaces of the floating gate electrode 9.3, which are situated in the (column) direction in which the bit line extends, are each covered by the control gate electrode 9.6.

With this structure of the present invention, the region where the floating gate electrode 9.3 and the control gate electrode 9.6 face with each other, can be increased as compared to the conventional memory cell, and therefore the electrostatic capacitance between the floating gate electrode 9.3 and the control gate electrode 9.6 can be increased.

Second, the lower portions of the lateral surfaces of the floating gate electrode 9.3 are not covered by the control gate electrode 9.6, but by the insulation film 9.9. The insulation film 9.9 has a function of an etching stopper during etching (RIE).

In the presence of the insulation film 9.9, the following effects can be obtained.

That is, since the insulation film 9.9 is present between the control gate electrode 9.6 and the source-drain diffusion layer 9.7, the withstand voltage between the control gate electrode 9.6 and the source-drain diffusion layer 9.7 can be improved.

Further, since the edge portion of the upper surface of the floating gate electrode 9.3 is covered by the control gate electrode 9.6, the edge portion is not oxidized. Thus, the variation in the capacitance between the floating gate electrode 9.3 and the control gate 9.6 can be prevented.

Furthermore, when the insulation film 9.9 is made of a silicon oxide film or a film which can transmit oxygen, the edge portion of the lower surface of the floating gate electrode 9.3 can be oxidized when necessary.

Third, the low-resistance material 10.2 is formed on the control gate electrode 9.6 and the upper surface of the low-resistance material 10.2 is made flat. That is, in the presence of the low-resistance material 10.2 on the control gate electrode 9.6, the resistance value of the word line can be decreased. Further, by making the upper surface of the low-resistance material 10.2 flat, the multiplexing of the wire layer or the yield of the product can be improved.

The method of manufacturing a non-volatile semiconductor memory device illustrated in FIGS. 32 to 34 will now be described.

Figure 35:
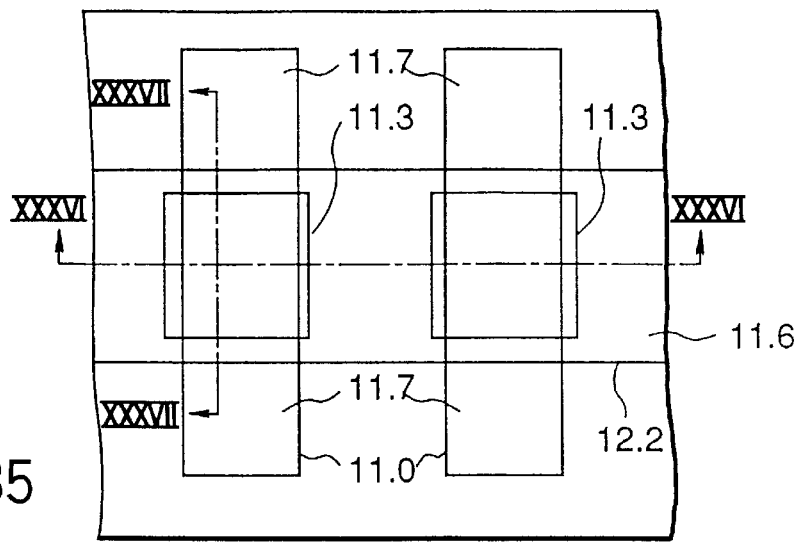
FIG. 35 is a plan view showing a step of the manufacturing method according to the present invention.
Figure 36:
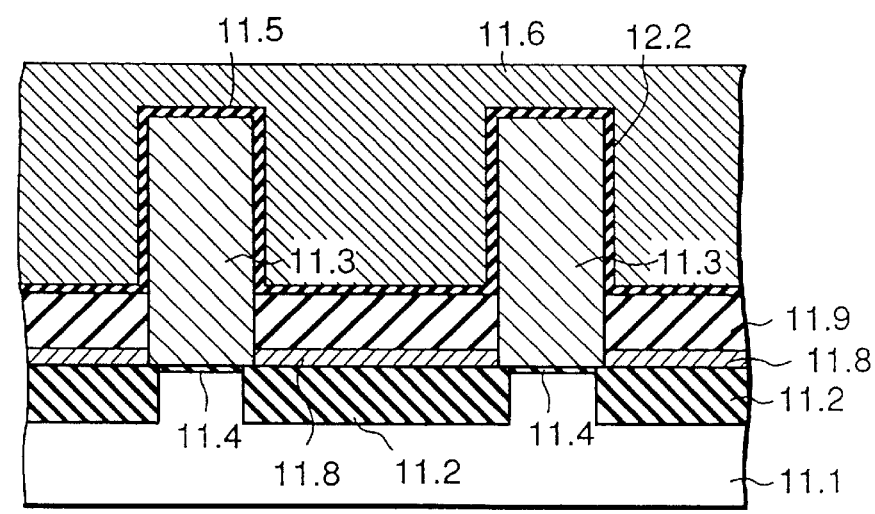
FIG. 36 is a cross sectional view taken along the line XXXVI—XXXVI in FIG. 35.
Figure 37:
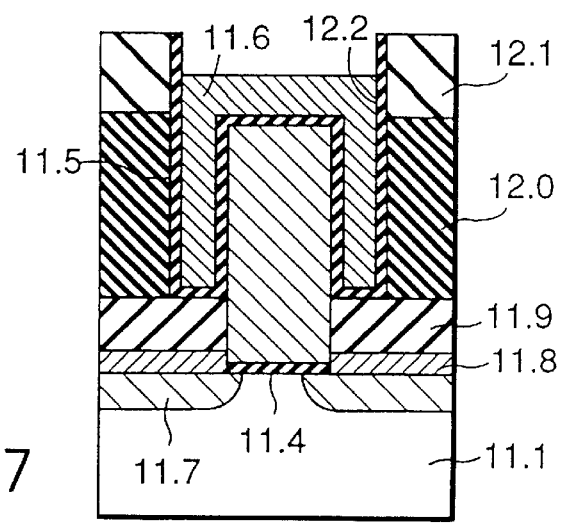
FIG. 37 is a cross sectional view taken along the line XXXVII—XXXVII in FIG. 35.

First, as can be seen in FIGS. 35 to 37, a groove is made in a p-type semiconductor substrate 11.1, and the grooves are filled with an insulation film, thus forming an element separation insulation film 11.2 having an STI structure. An element region 11.0 is defined in the region surrounded by the element separation insulation film 11.2.

Next, a silicon oxide film 11.8 containing an n-type impurity, such as a PSG film or AsSG film, is formed on an entire surface of the semiconductor substrate 11.1 by the CVD method. Further, a silicon nitride film 11.9 and a silicon oxide film 12.0 are formed in this order on the silicon oxide film 11.8 by the CVD method.

Further, a resist pattern is formed by the photolithographic technique, and with use of the resist pattern as a mask, the silicon oxide film 12.0, the silicon nitride film 11.9 and the silicon oxide film 11.8 are etched one after another, thus making an opening to expose the element region 11.0.

After that, a silicon oxide film (tunnel oxide film) 11.4 is formed on a bottom of the opening, that is, on the semiconductor substrate 11.1. Then, a polysilicon film which completely fills the opening is formed on the silicon oxide film 12.0. To the polysilicon film, an n-type impurity is introduced during or after the formation of the polysilicon film.

Then, the polysilicon film is polished by the CMP (chemical mechanical polishing) method, so as to leave the polysilicon film only in the opening. Thus, a floating gate electrode 11.3 is formed.

Further, a silicon oxide film 12.1 is formed on the floating gate electrode 11.3 and the silicon oxide film 12.0 by the CVD method.

It should be noted that a source-drain diffusion layer 11.7 is formed by diffusing an impurity from the silicon oxide film 11.8 to the semiconductor substrate 11.1 in a heating step which is carried out before the completion of the manufacture, after the formation of the silicon oxide film 11.8. The heating may be a step for forming the source-drain diffusion layer 11.7, or some other step for a different object.

Subsequently, a resist pattern is formed by the photolithographic technique, and with use of the resist pattern as a mask, the silicon oxide films 12.0 and 12.1 are etched to make a groove 12.2 having its length in the row direction, to cross over a plurality of floating gate electrodes 11.3 arranged in the row direction.

For the etching of the silicon oxide films 12.0 and 12.1, an etching method having a high etching selection ratio with respect to the silicon nitride film 11.9, such as RIE, should be employed. With such a method, the etching stops on the surface of the silicon nitride film 11.9, and therefore the level of the bottom of the groove 12.2 can be made higher than that of, at least, the lower surface of the floating gate electrode 11.3.

Further, the width of the groove 12.2 is set larger than that of the floating gate electrode 11.3 in the column direction. With this structure, the upper surface of the floating gate electrode 11.3 and the upper portions of the lateral surfaces of the floating gate electrode 11.3 are exposed in the groove 12.2.

After that, an inter-poly insulation film 11.5 is formed on the silicon nitride film 11.9 and the floating gate electrode 11.3. The inter-poly insulation film 11.5 has a structure in which, for example, a silicon oxide film ($SiO_2$), a silicon nitride film ($Si_3N_4$) and a silicon oxide film ($SiO_2$) are laminated together.

Next, a polysilicon film is formed on the inter-poly insulation film 11.5 by the CVD method. To this polysilicon film, an n-type impurity is introduced during or after the formation of the polysilicon film.

Then, the polysilicon film is polished by a CMP (chemical mechanical polishing) method, so as to leave the polysilicon only in the groove 12.2. As a result, in the groove 12.2, a control gate electrode 11.6 having a flat upper surface is formed. During this period, the polishing should be carried out under the condition that the level of the upper surface of the control gate electrode 11.6 should be situated lower than the upper surface of the groove 12.2 (that is, the upper surface of the insulation film 12.2).

Figure 38:
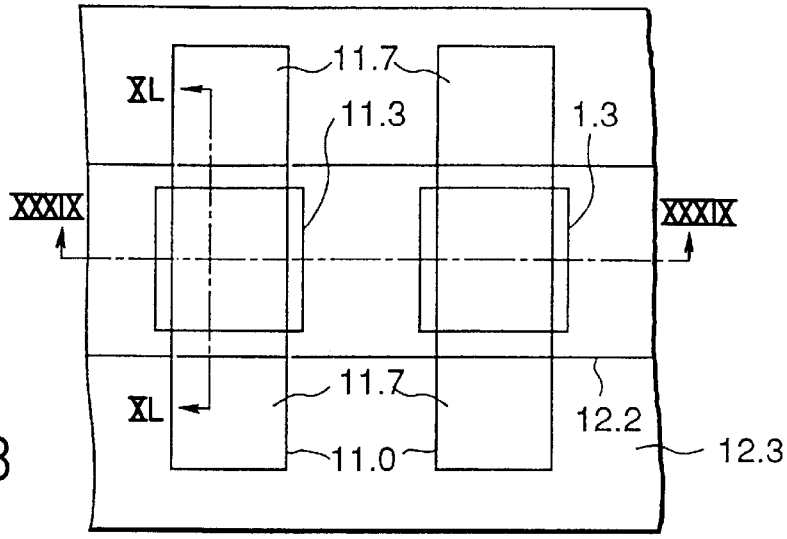
FIG. 38 is a plan view showing a step of the manufacturing method according to the present invention.
Figure 39:
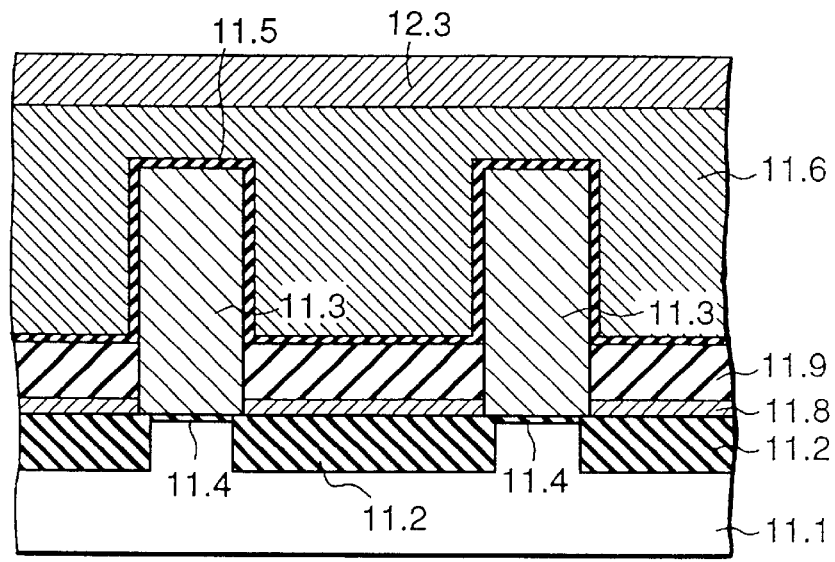
FIG. 39 is a cross sectional view taken along the line XXXIX—XXXIX in FIG. 38.
Figure 40:
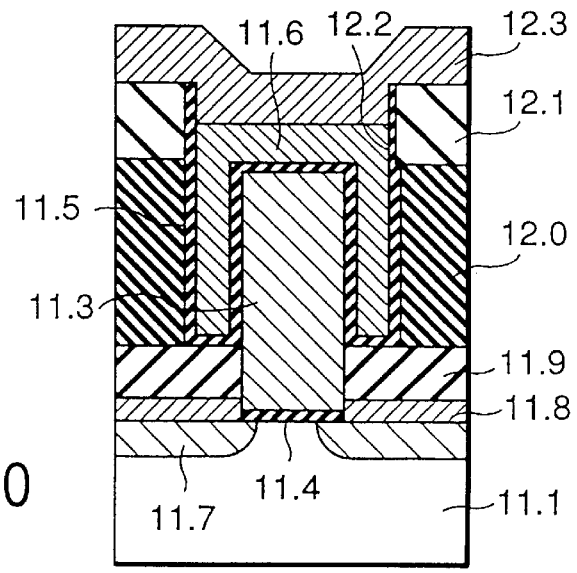
FIG. 40 is a cross sectional view taken along the line XL—XL in FIG. 38.

Next, as can be seen in FIGS. 38 to 40, a low-resistance material (such as a refractory metal or a refractory metal silicide) 12.3 is formed on the control gate electrode 11.6 and the insulation film 12.1 by the CVD method.

Figure 41:
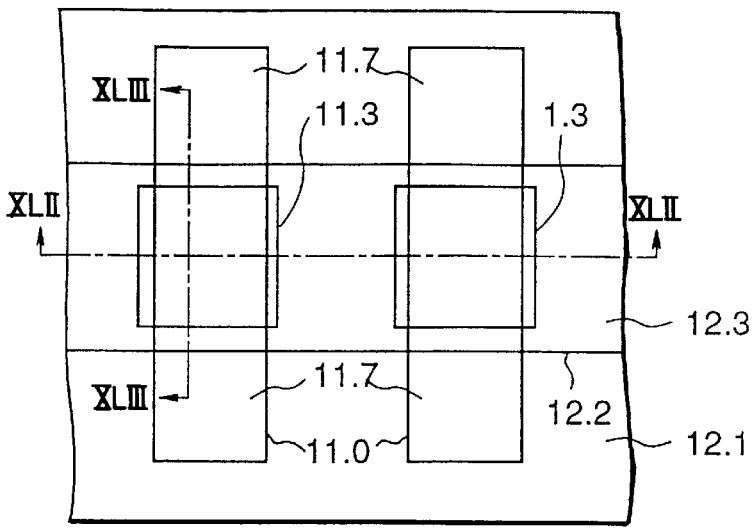
FIG. 41 is a plan view showing a step of the manufacturing method according to the present invention.
Figure 42:
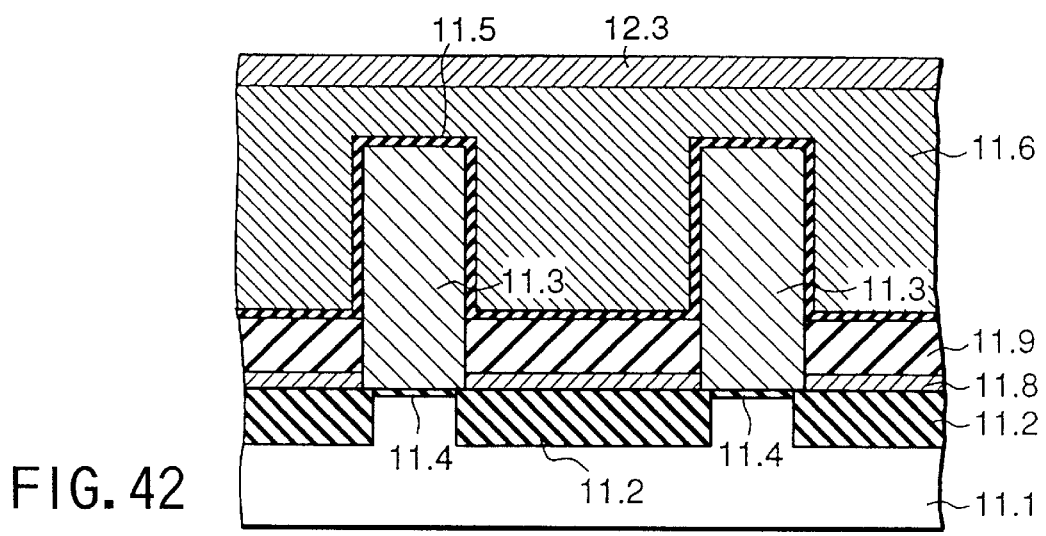
FIG. 42 is a cross sectional view taken along the line XLII—XLII in FIG. 41.
Figure 43:
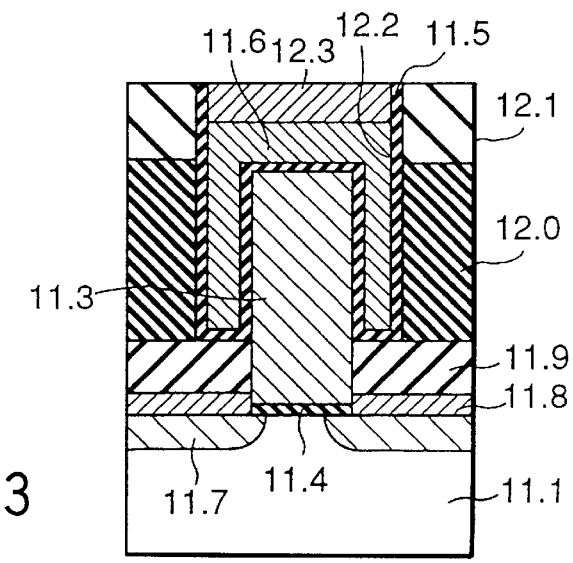
FIG. 43 is a cross sectional view taken along the line XLIII—XLIII in FIG. 41.

Then, as shown in FIGS. 41 to 43, the low-resistance material 12.3 is polished by the CMP (chemical mechanical polishing) method, so as to leave the low-resistance material 12.3 only on the control gate electrode 11.6 in the groove 12.2.

After the completion of the CMP, the level of the upper surface of the control gate electrode 7.6 is substantially equal to the level of the upper surface of the insulation film 8.1.

Thus, a memory cell of the non-volatile semiconductor memory device is completed.

Figure 44:
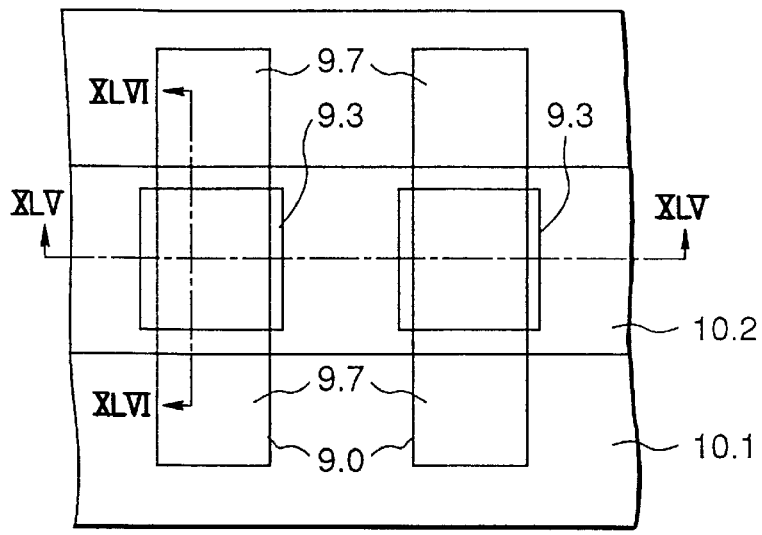
FIG. 44 is a plan view showing a fourth embodiment of the non-volatile semiconductor memory device according to the present invention.
Figure 45:
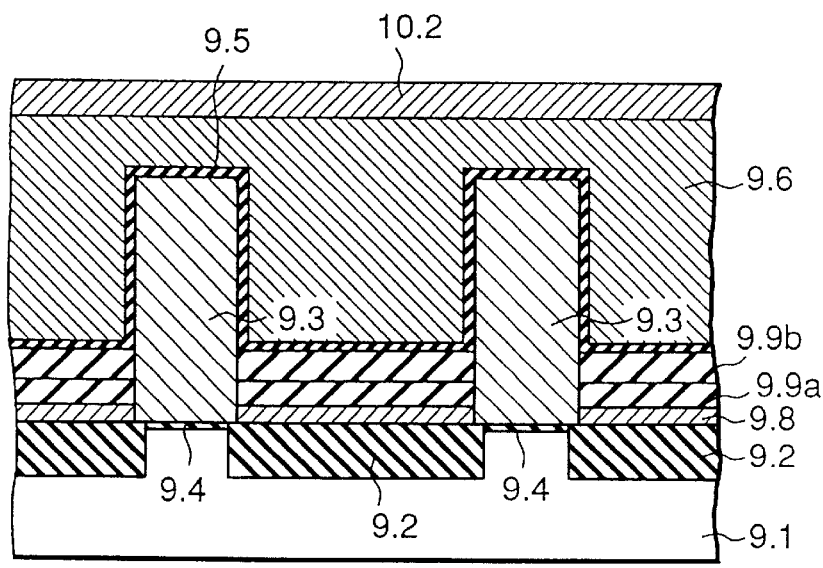
FIG. 45 is a cross sectional view taken along the line XLV—XLV in FIG. 44.
Figure 46:
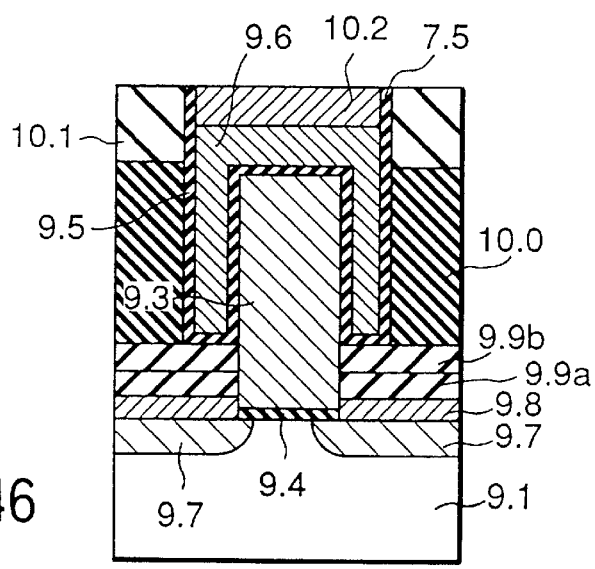
FIG. 46 is a cross sectional view taken along the line XLVI—XLVI in FIG. 44.

FIG. 44 is a diagram showing a fourth embodiment of the non-volatile semiconductor memory device according to the present invention. FIG. 45 is a cross section taken along the line XLV—XLV in FIG. 44, and FIG. 46 is a cross section taken along the line XLVI—XLVI in FIG. 44.

A p-type semiconductor substrate 9.1 has a narrow groove for element separation, formed in the substrate, and the groove is filled with an insulation film 9.2 (that is, the STI structure).

In an element region 9.0 surrounded by the insulation film 9.2, an n-type source-drain diffusion layer 9.7 is formed. On the source-drain diffusion layer 9.7, an insulation film 9.8 containing impurities, that is, for example, a PSG film or AsSG film, for forming the source-drain diffusion layer 9.7, is formed.

It should be noted that the insulation film 9.8 is necessary for the case where the source-drain diffusion layer 9.7 is formed by thermal diffusion, and this film 9.8 may not be present when the source-drain diffusion layer 9.7 is formed by, for example, the ion implantation.

On a channel region between the source-drain diffusion layer 9.7, a floating gate electrode 9.3 is formed via a gate insulation film 9.4. The gate insulation film 9.4 serves also as a tunnel insulation film which is a transfer path for transferring a charge (electrons) from the floating gate electrode 9.3 to the semiconductor substrate 9.1 or to the source-drain diffusion layer 9.7.

On a surface of the floating gate electrode 9.3, an inter-poly insulation film 9.5 is formed. A control gate electrode (word line) 9.6 is formed on the inter-poly insulation film 9.5 such as to cover the upper and lateral surfaces of the floating gate electrode 9.3. The control gate electrode 9.6 is made of a polysilicon film containing an impurity.

A low-resistance material (such as a refractory metal or a refractory metal silicide) 10.2 is formed on the control gate electrode 9.6.

The lower portions of the lateral surfaces of the floating gate electrode 9.3 are covered not by the control gate electrode 9.6, but by insulation films 9.9a and 9.9b. The insulation film 9.9a is used to oxidize the edge portion of the lower surface of the floating gate 9.3 and it is made of an oxide film such as silicon oxide film. As the insulation film 9.9b, a film capable of serving as an etching stopper in etching (RIE), such as a silicon nitride film, is used.

Insulation films (for example, silicon oxide films) 10.0 and 10.1 are formed on the insulation film 9.9b such as to cover the lateral surfaces of the control gate electrode 9.6 and the low-resistance material 10.2.

The features of the memory cell of the non-volatile semiconductor memory device will now be described in detail.

First, two lateral surfaces of the floating gate electrode 9.3, which are situated in the (row) direction in which the control gate electrode 9.6 extends, and two lateral surfaces of the floating gate electrode 9.3, which are situated in the (column) direction in which the bit line extends, are each covered by the control gate electrode 9.6.

With this structure of the present invention, the region where the floating gate electrode 9.3 and the control gate electrode 9.6 face with each other, can be increased as compared to the conventional memory cell, and therefore the electrostatic capacitance between the floating gate electrode 9.3 and the control gate electrode 9.6 can be increased.

Second, the lower portions of the lateral surfaces of the floating gate electrode 9.3 are covered by the control gate electrode 9.6, but by the insulation films 9.9a and 9.9b.

In the presence of the insulation films 9.9a and 9.9b, the following effects can be obtained.

That is, since the insulation films 9.9a and 9.9b are present between the control gate electrode 9.6 and the source-drain diffusion layer 9.7, the withstand voltage between the control gate electrode 9.6 and the source-drain diffusion layer 9.7 can be improved.

Further, since the edge portion of the upper surface of the floating gate electrode. 9.3 is covered by the control gate electrode 9.6, the edge portion is not oxidized. Thus, the variation in the capacitance between the floating gate electrode 9.3 and the control gate 9.6 can be prevented.

Furthermore, since the insulation film 9.9a is made of an oxide film such as a silicon oxide film, the edge portion of the lower surface of the floating gate electrode 9.3 can be oxidized when necessary. Also, when the insulation film 9.9b is made of a material having an etching selection ratio, such as a silicon oxide film, the structure in which the control gate electrode 9.6 does not reach the surface of the semiconductor substrate 9.1 can be easily obtained.

Third, the low-resistance material 10.2 is formed on the control gate electrode 9.6 and the upper surface of the low-resistance material 10.2 is made flat. That is, in the presence of the low-resistance material 10.2 formed on the control gate electrode 9.6, the resistance value of the word line can be decreased. Further, by making the upper surface of the low-resistance material 10.2 flat, the multiplexing of the wire layer or the yield of the product can be improved.

The non-volatile semiconductor memory device shown in FIGS. 44 to 46 can be manufactured by a method similar to that shown in FIGS. 35 to 43, except that in the manufacturing method illustrated in the FIGS. 35 to 42, the insulation film 11.9 has to be replaced by the insulation films 9.9a and 9.9b.

Each of the above-described embodiments is described in connection with the case where the present invention applied to a memory cell of a stack gate type EEPROM; however the present invention can be applied to a NOR, NAND or AND-type EEPROM as long as to has a similar structure to the above.

Further, the STI technique is employed as means for separating the element in these embodiments; however the element separation film made by the LOCOS method can be used.

In the above-described embodiments, the floating gate electrode has a rectangular parallelepiped shape; however as the size of memory cells is reduced, the shape of the floating gate electrode becomes columnar. Such a phenomenon is greatly related to the resolution of the photolithography carried out during the process of the floating gate electrode. In this case, the upper section of the floating gate electrode, situated on the source-drain side, preferably, the entire upper portion of the floating gate electrode is covered by the control gate electrode.

The memory cell may be made of an N-channel type MOS transistor, or P-channel type MOS transistor. The floating gate electrode can be made of a metal or metal silicide, other than polysilicon. In the case where the floating gate electrode is made of a metal or metal silicide, the interlayer insulation film situated between the floating gate electrode and the control gate electrode, is made of $SiO_2$ or $Ta_2O_5$, which can be deposited at low temperature.

As described above, with the non-volatile semiconductor memory device of the present invention and the method of manufacturing such a device, the following effects can be obtained.

First, lateral surfaces of the floating gate electrode, which are situated in the (row) direction in which the control gate electrode extends, and lateral surfaces of the floating gate electrode, which are situated in the (column) direction in which the bit line extends, are each covered by the control gate electrode.

With this structure of the present invention, the region where the floating gate electrode and the control gate electrode face with each other, can be increased as compared to the conventional memory cell, in which only the lateral surfaces of the floating gate electrode, situated where the control gate electrode extends, and therefore the electrostatic capacitance between the floating gate electrode and the control gate electrode can be increased.

A specific example of the just-mentioned structure will now be described.

Let us suppose that the floating gate electrode is a rectangular parallelopiped having measurements of 0.25 μm (width)×0.25 μm (length)×0.2 μm (height), the thickness of the gate insulation film (tunnel oxidation film) is 10 nm, and the inter-poly insulation film is 14 nm.

With this specification, the coupling ratio of the conventional memory cell is about 0.65. Therefore, in the case where there is no excessive charge in the floating gate electrode, when a voltage of about 19V is applied to the control gate electrode (word line), the potential of the floating gate electrode becomes about 12.35V, and a Fowler-Nordheim tunnel current flows to the tunnel oxide film.

By contrast, for the same specification, the coupling ratio of the memory cell of the present invention is about 0.75. Therefore, in the case where there is no excessive charge in the floating gate electrode, when a voltage of about 16V is applied to the control gate electrode (word line), the potential of the floating gate electrode becomes about 12V, and a Fowler-Nordheim tunnel current flows to the tunnel oxide film.

In other words, according to the present invention, the writing of data, which is carried out by implanting electrons to the floating gate electrode, can be performed in the state where the potential of the floating gate electrode is about 3V lower than the case of the conventional technique.

Second, the lower portions of the lateral surfaces of the floating gate electrode are covered by the control gate electrode, but by the insulation films. With this structure, the withstand voltage between the control gate electrode and the source-drain diffusion layer can be improved.

Further, since the edge portion of the upper surface of the floating gate electrode is covered by the control gate electrode, the edge portion is not oxidized. Thus, the variation in the capacitance between the floating gate electrode and the control gate can be prevented.

Figure 47:
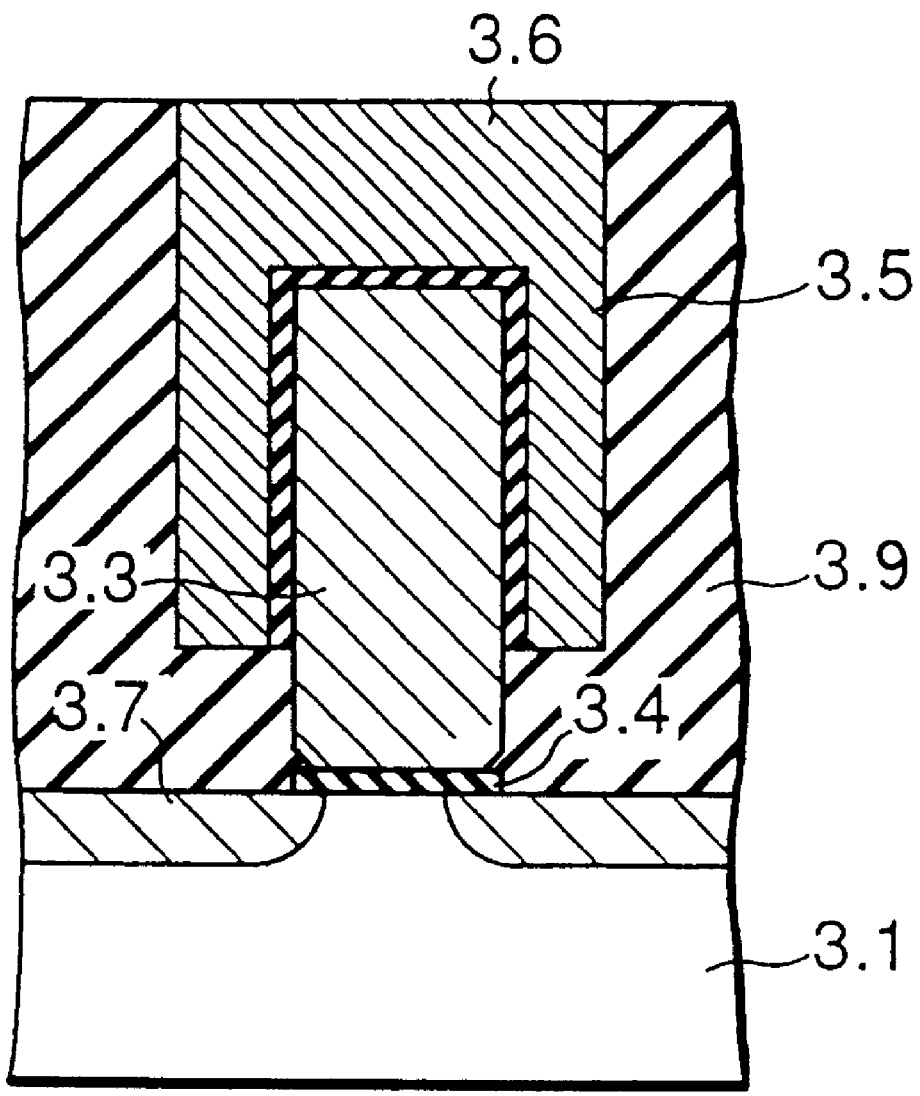
FIG. 47 is a cross sectional view showing a memory device in which the edge portion of the lower surface of the floating gate electrode is oxidized.

Furthermore, when the insulation film is made of an oxide film which can transmits oxygen such as a silicon oxide film, as shown in FIG. 47, the edge portion of the lower surface of the floating gate electrode can be oxidized when necessary.

Third, since the upper surface of the control gate electrode is made flat, the multiplexing of the wire layer or the yield of the product can be improved. Further, when a low-resistance material is formed on the control gate electrode, the resistance value of the word line can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A non-volatile semiconductor memory device comprising:

a semiconductor substrate;

an element separation film formed on said semiconductor substrate;

source-drain diffusion layers formed in an element region;

a charge storage layer formed above a channel region formed between said source-drain diffusion layers;

a control gate electrode which covers at least an upper surface of said charge storage layer and an upper portion of lateral surfaces of said charge storage layer, which are located above the source-drain diffusion layers;

an insulation film which covers a lower portion of the lateral surfaces of said charge storage layer, which are located above the source-drain diffusion layers; and an inter-layer insulation film formed between said charge storage layer and said control gate electrode.

2. The non-volatile semiconductor memory device according to claim 1, wherein the upper surface of said control gate electrode and the upper surface of said insulation film are made substantially flat and leveled with each other.

3. A non-volatile semiconductor memory device comprising:

a semiconductor substrate;

an element separation film formed on said semiconductor substrate;

source-drain diffusion layers formed in an element region;

a charge storage layer formed above a channel region formed between said source-drain diffusion layers;

a control gate electrode which covers at least an upper surface of said charge storage layer and an upper portion of lateral surfaces of said charge storage layer, which are located above the source-drain diffusion layers, a first insulation film which covers a lower portion of the lateral surfaces of said charge storage layer, which are located above the source-drain diffusion layers; and a second insulation film formed between said charge storage layer and said control gate electrode.

4. The non-volatile semiconductor memory device according to claim 3, wherein said first insulation film is thicker than a gate insulation film.

5. The non-volatile semiconductor device according to claim 3, further comprising: a third insulation film formed on said first insulation film, which covers the lateral surfaces of said control gate electrode, and has an etching selective ratio with respect to said first insulation film.

6. The non-volatile semiconductor memory device according to claim 3, wherein said first insulation film is made of a silicon oxide film, and an edge portion of the lower surface of said charge storage layer is oxidized.

7. The non-volatile semiconductor memory device according to claim 3, wherein said first insulation film is made of a plurality of insulation films including at least silicon oxide film, and the edge portion of the lower surface of said charge storage layer is oxidized.

8. The non-volatile semiconductor memory device according to claim 5, wherein said first insulation film is made of a silicon nitride film, and said third insulation film is made of a silicon oxide film.

9. The non-volatile semiconductor memory device according to claim 3, further comprising:
- a material formed on said control gate electrode and said material has a resistance value lower than that of said control gate electrode; and
- a third insulation film, formed on said first insulation film, for covering lateral surfaces of said control gate electrode and lateral surfaces of said material, wherein the upper surface of said material and the upper surface of said third insulation film are made substantially flat and leveled with each other.

* * * * *